(12) United States Patent
Truettner et al.

(10) Patent No.: US 12,262,516 B2
(45) Date of Patent: Mar. 25, 2025

(54) BATTERY PACK, CHARGER AND DISCONNECT SYSTEM

(71) Applicant: MILWAUKEE ELECTRIC TOOL CORPORATION, Brookfield, WI (US)

(72) Inventors: Donald J. Truettner, Waukesha, WI (US); Jeffrey M. Brozek, Mequon, WI (US); Steven T. Sommerfeld, Mukwonago, WI (US); Cameron R. Schulz, Milwaukee, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

(21) Appl. No.: 18/527,797

(22) Filed: Dec. 4, 2023

(65) Prior Publication Data

US 2024/0164070 A1 May 16, 2024

Related U.S. Application Data

(63) Continuation of application No. 17/061,733, filed on Oct. 2, 2020, now Pat. No. 11,839,066, which is a
(Continued)

(51) Int. Cl.
*H05K 7/20* (2006.01)
*G01K 1/14* (2021.01)
(Continued)

(52) U.S. Cl.
CPC ........... *H05K 7/20909* (2013.01); *G01K 1/14* (2013.01); *H02J 7/0042* (2013.01);
(Continued)

(58) Field of Classification Search
CPC .............................. H02J 7/0042; H02J 7/0045
See application file for complete search history.

(56) References Cited

U.S. PATENT DOCUMENTS

| 2,571,048 A | 10/1951 | Medlar |
| 3,766,345 A | 10/1973 | Attia |

(Continued)

FOREIGN PATENT DOCUMENTS

| CN | 2809570 | 8/2006 |
| CN | 1870381 | 11/2006 |

(Continued)

OTHER PUBLICATIONS

International Search Report and Written Opinion for Application No. PCT/US2018/039456 dated Oct. 26, 2018, 15 pages.
(Continued)

*Primary Examiner* — David V Henze-Gongola
(74) *Attorney, Agent, or Firm* — Michael Best & Friedrich LLP

(57) ABSTRACT

A battery charger and a method of operating a battery charger. The charger may include a housing defining an air inlet and an air outlet; a charging circuit operable to output a charging current to charge a battery couplable to the battery charger; a tubular heat sink; and a fan operable to cause air flow from the air inlet to the air outlet and along the heat sink. The charger may include a first switch operable to electrically connect the charging circuit to a power source when the battery engages the charger; and a second switch operable to electrically connect the charging circuit to a battery terminal after the charger terminal is electrically connected to the battery terminal. The charging current or a fan speed may be adjusted based on at least one of the temperature of the charger or a temperature of the battery.

20 Claims, 23 Drawing Sheets

Related U.S. Application Data continuation of application No. 16/018,533, filed on Jun. 26, 2018, now Pat. No. 10,827,655.

(60) Provisional application No. 62/524,827, filed on Jun. 26, 2017.

(51) Int. Cl.
*H01M 10/48* (2006.01)
*H02J 7/00* (2006.01)

(52) U.S. Cl.
CPC ......... *H05K 7/20172* (2013.01); *H05K 7/209* (2013.01); *H05K 7/20945* (2013.01); *H01M 10/486* (2013.01)

(56) References Cited

U.S. PATENT DOCUMENTS

| | | |
|---|---|---|
| 4,245,665 A | 1/1981 | Anderson et al. |
| 4,288,733 A | 9/1981 | Bilanceri et al. |
| 4,992,687 A | 2/1991 | Nel |
| 5,239,163 A | 8/1993 | Brouwers |
| 5,408,209 A | 4/1995 | Tanzer et al. |
| 5,647,450 A | 7/1997 | Ogawa et al. |
| 5,686,808 A | 11/1997 | Lutz |
| 5,887,063 A | 3/1999 | Varadharajan et al. |
| 5,909,101 A | 6/1999 | Matsumoto et al. |
| 5,982,152 A | 11/1999 | Watanabe et al. |
| 5,995,711 A | 11/1999 | Fukuoka et al. |
| 6,066,938 A | 5/2000 | Hyodo et al. |
| 6,178,292 B1 | 1/2001 | Fukuoka et al. |
| 6,286,109 B1 | 9/2001 | Pirdy |
| 6,307,142 B1 | 10/2001 | Allen et al. |
| 6,455,186 B1 | 9/2002 | Moores, Jr. et al. |
| 6,597,572 B2 | 7/2003 | Nishikawa et al. |
| 6,624,615 B1 | 9/2003 | Park |
| 6,645,666 B1 | 11/2003 | Moores, Jr. et al. |
| 6,878,481 B2 | 4/2005 | Bushong et al. |
| 6,924,620 B2 | 8/2005 | Santana, Jr. |
| 6,949,309 B2 | 9/2005 | Moores, Jr. et al. |
| 6,967,464 B2 | 11/2005 | Heigl et al. |
| 6,975,092 B2 | 12/2005 | Edington et al. |
| 6,999,312 B1 | 2/2006 | Garnett et al. |
| 7,014,945 B2 | 3/2006 | Moores, Jr. et al. |
| 7,056,616 B2 | 6/2006 | Moores, Jr. et al. |
| 7,189,473 B2 | 3/2007 | Smith et al. |
| 7,252,904 B2 | 8/2007 | Moores, Jr. et al. |
| 7,270,910 B2 | 9/2007 | Yahnker et al. |
| 7,323,846 B2 | 1/2008 | Santana, Jr. |
| 7,326,490 B2 | 2/2008 | Moores, Jr. et al. |
| 7,456,605 B2 | 11/2008 | Nakasho et al. |
| 7,498,766 B2 | 3/2009 | Paul et al. |
| 7,508,171 B2 | 3/2009 | Carrier et al. |
| 7,525,288 B2 | 4/2009 | Tashiro et al. |
| 7,554,288 B2 | 6/2009 | Gangstoe et al. |
| 7,579,809 B2 | 8/2009 | Bowles et al. |
| 7,592,773 B2 | 9/2009 | Pellenc |
| 7,592,779 B2 | 9/2009 | Miwa et al. |
| 7,598,710 B2 | 10/2009 | Zhang |
| 7,602,146 B2 | 10/2009 | Carrier et al. |
| 7,659,692 B2 | 2/2010 | Sainomoto et al. |
| 7,667,429 B2 | 2/2010 | Little |
| 7,692,408 B2 | 4/2010 | Miyazaki et al. |
| 7,736,792 B2 | 6/2010 | Moores, Jr. et al. |
| 7,743,988 B2 | 6/2010 | Zemba et al. |
| 7,859,220 B2 | 12/2010 | Bushong et al. |
| 7,868,588 B2 | 1/2011 | Altekruse et al. |
| 7,900,045 B2 | 3/2011 | Rager et al. |
| 7,939,193 B2 | 5/2011 | Moores, Jr. et al. |
| 7,941,865 B2 | 5/2011 | Seman, Jr. et al. |
| RE42,468 E | 6/2011 | Heigl et al. |
| 8,014,831 B2 | 9/2011 | Brown et al. |
| 8,035,352 B2 | 10/2011 | Zhang |
| 8,089,247 B2 | 1/2012 | Pellenc |
| 8,269,458 B2 | 9/2012 | Cruise et al. |
| 8,513,922 B2 | 8/2013 | Yang et al. |
| 8,525,473 B2 | 9/2013 | Shimizu et al. |
| 8,564,242 B2 | 10/2013 | Hansford et al. |
| 8,749,197 B2 | 6/2014 | You et al. |
| 8,752,645 B2 | 6/2014 | Liebard |
| 8,994,339 B1 | 3/2015 | Kam |
| 9,035,597 B2 | 5/2015 | Sharaf et al. |
| 9,133,822 B2 | 9/2015 | Tang |
| 9,142,992 B2 | 9/2015 | Malackowski et al. |
| 9,150,106 B2 | 10/2015 | Park et al. |
| 9,155,900 B2 | 10/2015 | Meskens |
| 9,186,787 B2 | 11/2015 | Noda et al. |
| 9,197,096 B2 | 11/2015 | Bhardwaj |
| 9,225,184 B2 | 12/2015 | Rief |
| 9,270,463 B2 | 2/2016 | Unagami et al. |
| 9,288,063 B2 | 3/2016 | Unagami et al. |
| 9,331,365 B2 | 5/2016 | Cruise et al. |
| 9,391,472 B2 | 7/2016 | Iyasu et al. |
| 9,419,462 B2 | 8/2016 | Sollanek |
| 9,445,266 B2 | 9/2016 | Fyke et al. |
| 9,537,344 B2 | 1/2017 | Thompson et al. |
| 9,553,468 B2 | 1/2017 | Bhardwaj |
| 9,608,461 B2 | 3/2017 | Chen et al. |
| 9,969,286 B2 | 3/2018 | Jiang et al. |
| 10,827,655 B2 * | 11/2020 | Truettner .................. H02J 7/02 |
| 2002/0034682 A1 * | 3/2002 | Moores, Jr. ........... H02J 7/0044 429/71 |
| 2003/0074572 A1 | 4/2003 | Hayashi |
| 2003/0102845 A1 * | 6/2003 | Aker ...................... H02J 7/0047 320/140 |
| 2004/0145344 A1 | 7/2004 | Bushong et al. |
| 2005/0010782 A1 | 1/2005 | Ohkubo |
| 2005/0073282 A1 | 4/2005 | Carrier et al. |
| 2007/0120524 A1 * | 5/2007 | Shum .................... H02J 7/0045 320/106 |
| 2007/0122692 A1 | 5/2007 | Smith et al. |
| 2007/0139004 A1 | 6/2007 | Satsuma |
| 2007/0260892 A1 | 11/2007 | Paul et al. |
| 2008/0290836 A1 | 11/2008 | Tsai et al. |
| 2009/0021913 A1 * | 1/2009 | Kuan ..................... H01L 23/467 361/711 |
| 2009/0167253 A1 | 7/2009 | Muraoka et al. |
| 2009/0292918 A1 | 11/2009 | Mori et al. |
| 2010/0283431 A1 | 11/2010 | Kano |
| 2012/0049788 A1 | 3/2012 | Kim et al. |
| 2012/0227926 A1 | 9/2012 | Field et al. |
| 2013/0278217 A1 | 10/2013 | Gray |
| 2014/0034103 A1 | 2/2014 | Kellie et al. |
| 2014/0158389 A1 | 6/2014 | Ito et al. |
| 2014/0199971 A1 | 7/2014 | Totzke et al. |
| 2014/0312843 A1 | 10/2014 | Chen et al. |
| 2014/0318746 A1 | 10/2014 | Kwak et al. |
| 2014/0340025 A1 | 11/2014 | Rief |
| 2015/0077042 A1 | 3/2015 | Seidel et al. |
| 2015/0077043 A1 | 3/2015 | Seidel et al. |
| 2015/0084591 A1 | 3/2015 | Kishima et al. |
| 2015/0145484 A1 | 5/2015 | Shibata et al. |
| 2015/0155724 A1 | 6/2015 | Han et al. |
| 2015/0207359 A1 | 7/2015 | Ok et al. |
| 2016/0050563 A1 | 2/2016 | Bronk |
| 2016/0123571 A1 | 5/2016 | Chan et al. |
| 2016/0181849 A1 | 6/2016 | Govindaraj |
| 2016/0190850 A1 | 6/2016 | Jeganathan et al. |
| 2016/0204626 A1 | 7/2016 | Cruz et al. |
| 2016/0248075 A1 | 8/2016 | Cruise et al. |
| 2016/0294206 A1 | 10/2016 | Okawa et al. |
| 2016/0359350 A1 | 12/2016 | Uesugi |
| 2017/0047769 A1 | 2/2017 | Kim et al. |
| 2017/0047784 A1 | 2/2017 | Jung et al. |
| 2017/0077729 A1 * | 3/2017 | Sato ...................... H02J 7/0045 |
| 2017/0331302 A1 * | 11/2017 | Namiki .................. H01M 10/46 |
| 2018/0191183 A1 * | 7/2018 | Namiki ............... H05K 7/20145 |

FOREIGN PATENT DOCUMENTS

| | | |
|---|---|---|
| CN | 101237070 | 9/2010 |
| CN | 201742345 | 2/2011 |

(56) References Cited

FOREIGN PATENT DOCUMENTS

| CN | 202348735 | 7/2012 |
|---|---|---|
| CN | 203481874 | 3/2014 |
| CN | 104659834 | 5/2015 |
| CN | 104753121 | 7/2015 |
| CN | 204856370 | 12/2015 |
| CN | 205808171 | 12/2016 |
| DE | 102004020147 | 11/2005 |
| DE | 102007024317 | 11/2008 |
| DE | 202016105142 | 12/2016 |
| EP | 1475876 | 11/2004 |
| EP | 1746679 | 1/2007 |
| WO | 0031608 | 6/2000 |
| WO | 2015124980 | 8/2015 |
| WO | 2015129419 | 9/2015 |
| WO | 2015129420 | 9/2015 |
| WO | 2015186999 | 12/2015 |
| WO | 2016142458 | 9/2016 |
| WO | 2017002519 | 1/2017 |
| WO | 2017083405 | 5/2017 |

OTHER PUBLICATIONS

Tools in Action, DeWALT Portable Power Station & 60v and 20V Charger Charger DCB1800—First Look, Jun. 29, 2016; https://www.youtube.com/watch?v=mPE32YCwJJA, accessed Sep. 30, 2019.

WorkshopAddict, DeWALT Portable Power Station & Charger—DCB1800, Jun. 23, 2016; https://www.youtube.com/watch?v=8w-uMmkJ2KE, accessed Sep. 30, 2019.

A Concord Carpenter / ToolBoxBuzz, DeWALT 1800 Watt Portable Power Station DCB1800, Jun. 25, 2016; https://www.youtube.com/watch?v=-GiL2vmCB6g, accessed Sep. 30, 2019.

DeWALT 1800 Portable Power Station and Charger Documentation, tool was publicly available as early as Jul. 30, 2018 (37 pages).

Chinese Patent Office Action for Application No. 20211091941.2 dated Sep. 26, 2024 (24 pages including machine English translation).

\* cited by examiner

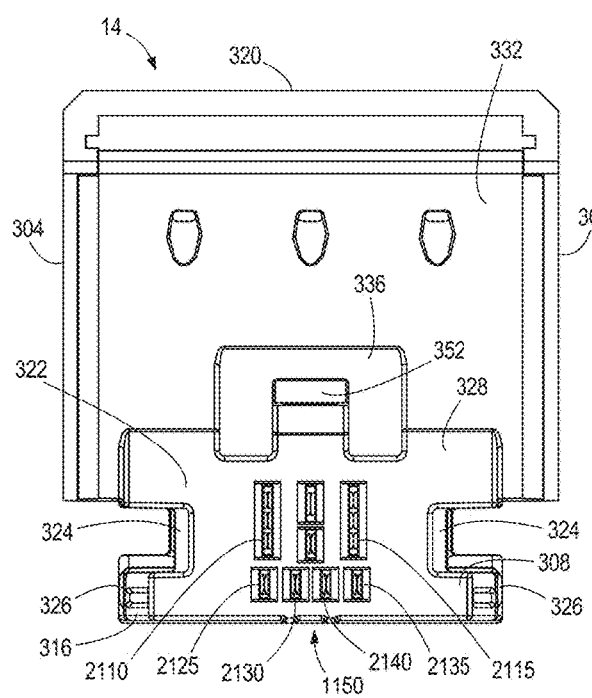
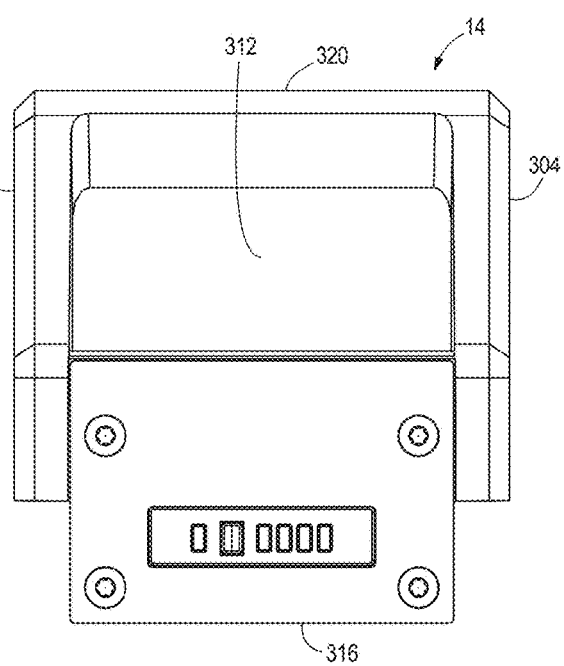
FIG. 17
FIG. 18

BATTERY PACK, CHARGER AND DISCONNECT SYSTEM

RELATED APPLICATIONS

This application is a continuation of U.S. patent application Ser. No. 17/061,733, filed Oct. 2, 2020, which is a continuation of U.S. patent application Ser. No. 16/018,533, filed Jun. 26, 2018, which claims the benefit of U.S. Provisional Patent Application No. 62/524,827, filed Jun. 26, 2017, the entire content of each of which is hereby incorporated by reference.

FIELD

The present invention relates to battery chargers and, more particularly, to controlling and/or cooling controlling a battery charger.

SUMMARY

In one independent embodiment, a battery charger may generally include a housing defining an air inlet and an air outlet; a charging circuit positioned within the housing and operable to output a charging current to charge a battery couplable to the battery charger; a tubular heat sink operable to dissipate heat in the housing; and a fan operable to cause air flow from the air inlet to the air outlet and along the heat sink.

The heat sink may define a flow path, and the fan may be operable to cause air flow through the flow path. The flow path may have a path inlet and a path outlet, and the fan may be positioned between the path outlet and the air outlet. A baffle may be positioned between the path outlet and the fan.

The heat sink may include a plurality of tubes defining a plurality of flow paths. The tubes may be positioned adjacent to one another. The tubes may be stacked above one another. Air may flow in a first direction along one of the flow paths, and air may flow in a second direction along another one of the flow paths, the second direction being different than the first direction. The heat sink including the plurality of tubes may be formed as a unitary piece.

The charging circuit may be electrically connectable to a power source, the charging circuit including a charger terminal electrically connectable to a battery terminal of the battery. A first switch may be operable to electrically connect the charging circuit to the power source when the battery engages the battery charger, and a second switch may be operable to electrically connect the charging circuit to the battery terminal after the charger terminal is electrically connected to the battery terminal. The first switch and the second switch may be supported on the housing and operable through engagement with the battery. The first switch and the second switch may be arranged on the housing such that, during coupling of the battery to the battery charger, the first switch is engaged by the battery before the second switch. The second switch may be supported on the housing such that, during removal of the battery from the battery charger, the second switch is disengaged before the battery terminal disengages the charger terminal. The first switch may include an AC micro switch, and the second switch may include a DC micro switch.

The battery charger may include a first sensor for sensing a temperature of the battery charger, and the battery may include a second sensor for sensing a temperature of the battery. The first sensor may be positioned proximate one of the charging circuit and the heat sink. The fan may have a fan speed, and one of the charging current or the fan speed may be adjusted based on at least one of the temperature of the battery charger or the temperature of the battery. A controller may be operable to receive a signal indicative of the temperature of the battery charger from the first sensor and a signal indicative of the temperature of the battery from the second sensor.

In another independent aspect, a method for operating a battery charger may be provided, the battery charger including a housing defining an air inlet and an air outlet, a charging circuit positioned within the housing, the charging circuit being operable to output a charging current to charge a battery couplable to the battery charger, a tubular heat sink positioned within the housing, and a fan positioned within the housing. The method may generally include causing air flow, by the fan, from the air inlet to the air outlet and along the heat sink.

The heat sink may define a flow path, and causing air flow may include causing air flow through the flow path. The flow path may have a path inlet and a path outlet, wherein the fan is positioned between the path outlet and the air outlet, the battery charger may further include a baffle between the path outlet and the fan, and causing air flow may further include causing air flow through the baffle before the air flow exits the housing through the air outlet. The heat sink may include a plurality of tubes defining a plurality of flow paths, and causing air flow may include causing air flow through each of the flow paths. Causing air flow may include causing air flow in a first direction along one of the flow paths, and causing air flow in a second direction along another one of the flow paths, the second direction being different than the first direction.

The charging circuit may be electrically connectable to a power source and may include a charger terminal electrically connectable to a battery terminal, and the method may further include operating a first switch to electrically connect the charging circuit to the power source; and, after the charger terminal is electrically connected to the battery terminal, operating a second switch to electrically connect the charging circuit to the battery terminal. Operating the first switch may include engaging the battery with the first switch to operate the first switch, and operating the second switch may include engaging the battery with the second switch to operate the second switch.

During coupling of the battery to the battery charger, operating the second switch may occur after operating the first switch. During removal of the battery from the battery charger, operating the second switch may include disengaging the second switch before the battery terminal is disengaged from the charger terminal. The battery charger may further include a controller, and disengaging the second switch may include transmitting a signal to the controller.

The method may include sensing a temperature of the battery charger; sensing a temperature of the battery; and adjusting the charging current or a fan speed based on at least one of the temperature of the battery charger or the temperature of the battery. The battery charger may include a sensor positioned proximate one of the charging circuit and the heat sink, and sensing the temperature of the battery charger may include sensing a temperature proximate one of the charging circuit or the heat sink.

The battery may include a sensor, and sensing the temperature of the battery may include sensing using the sensor of the battery. The battery charger may include a controller and a first sensor for sensing the temperature of the battery charger, the battery may include a second sensor for sensing the temperature of the battery, and the method may further include receiving, with the controller, a signal indicative of the temperature of the battery charger from the first sensor and a signal indicative of the temperature of the battery from the second sensor.

In yet another independent embodiment, a battery charger may generally include a housing; a charging circuit positioned within the housing, the charging circuit being electrically connectable to a power source and operable to output a charging current to charge a battery couplable to the battery charger, the circuit including a charger terminal electrically connectable to a battery terminal of the battery; a first switch operable to electrically connect the charging circuit to the power source when the battery engages the battery charger; and a second switch operable to electrically connect the charging circuit to the battery terminal after the charger terminal is electrically connected to the battery terminal.

The first switch and the second switch may be supported on the housing and operable through engagement with the battery. The first switch and the second switch may be arranged on the housing such that, during coupling of the battery to the battery charger, the first switch is engaged by the battery before the second switch. The second switch may be supported on the housing such that, during removal of the battery from the battery charger, the second switch may be disengaged before the battery terminal disengages the charger terminal. The first switch may include an AC micro switch, and the second switch may include a DC micro switch.

The housing may define an air inlet and an air outlet, and the battery charger may further include a tubular heat sink operable to dissipate heat in the housing; and a fan operable to cause air flow from the air inlet to the air outlet and along the heat sink. The heat sink may define a flow path, and the fan may be operable to cause air flow through the flow path. The flow path may have a path inlet and a path outlet, and the fan may be positioned between the path outlet and the air outlet. A baffle may be positioned between the path outlet and the fan.

The heat sink may include a plurality of tubes defining a plurality of flow paths. Air may flow in a first direction along one of the flow paths, and air may flow in a second direction along another one of the flow paths, the second direction being different than the first direction. The heat sink including the plurality of tubes may be formed as a unitary piece.

The battery charger may include a sensor for sensing a temperature of the battery charger. The battery charger may include a tubular heat sink, and the sensor may be positioned proximate one of the charging circuit and the heat sink. A fan may be positioned in the housing, and one of the charging current or a fan speed may be adjusted based on at least one of the temperature of the battery charger or a temperature of the battery. A controller may be operable to receive a signal indicative of the temperature of the battery charger from the first sensor and a signal indicative of a temperature of the battery from the second sensor.

In a further independent embodiment, a method of operating a battery charger may be provided, the battery charger including a housing, and a charging circuit positioned within the housing, the charging circuit electrically connectable to a power source and operable to output a charging current to charge a battery couplable to the battery charger, the circuit including a charger terminal electrically connectable to a battery terminal. The method may include operating a first switch to electrically connect the charging circuit to the power source; and, after the charger terminal is electrically connected to the battery terminal, operating a second switch to electrically connect the charging circuit to the battery terminal.

Operating the first switch may include engaging the battery with the first switch to operate the first switch, and operating the second switch may include engaging the battery with the second switch to operate the second switch. During coupling of the battery to the battery charger, operating the second switch may occur after operating the first switch. During removal of the battery from the battery charger, the second switch may be disengaged before the battery terminal is disengaged from the charger terminal.

The battery charger may further include a controller, and disengaging the second switch may include transmitting a signal to the controller. The battery charger may include a fan, and the method may further include sensing a temperature of the battery charger; sensing a temperature of the battery; and adjusting the charging current or a fan speed based on at least one of the temperature of the battery charger or the temperature of the battery.

The battery charger may include a sensor positioned in the housing, and sensing the temperature of the battery charger may include sensing a temperature with the sensor. The battery charger may include a tubular heat sink positioned within the housing, the sensor may be positioned proximate one of the charging circuit and the heat sink, and sensing the temperature of the battery charger may include sensing a temperature proximate one of the charging circuit and the heat sink. The battery may include a sensor, and sensing the temperature of the battery may include sensing with the sensor. The battery charger may include a controller and a first sensor for sensing the temperature of the battery charger, the battery may include a second sensor for sensing the temperature of the battery, the method may further include receiving, with the controller, a signal indicative of the temperature of the battery charger from the first sensor, and the temperature of the battery from the second sensor.

The housing may define an air inlet and an air outlet, the battery charger may include a tubular heat sink and a fan positioned within the housing, and the method may further include causing air flow, by the fan, from the air inlet to the air outlet and along the heat sink. The heat sink may define a flow path, and causing air flow may include causing air flow through the flow path. The flow path may have a path inlet and a path outlet, the fan may be positioned between the path outlet and the air outlet, the battery charger may further include a baffle between the path outlet and the fan, and causing air flow may further include causing air flow through the baffle before the air flow exits the housing through the air outlet.

The heat sink may include a plurality of tubes defining a plurality of flow paths, and causing air flow may include causing air flow through each of the flow paths. Causing air flow may include causing air flow in a first direction along one of the flow paths, and causing air flow in a second direction along another one of the flow paths, the second direction being different than the first direction.

In another independent embodiment, a battery charger for a battery may be provided, the battery including a battery housing and battery cells supported by the battery housing. The battery charger may include a housing; a charging circuit positioned within the housing and operable to output a charging current to charge a battery couplable to the battery charger, the battery including a battery housing and battery cells supported by the battery housing; a fan operable to cause air flow through the housing; and a charger temperature sensor positioned within the housing and for sensing a temperature of the battery charger. The charging current or a fan speed may be adjusted based on at least one of the temperature of the battery charger or a temperature of the battery.

A heat sink may be positioned within the housing, the charger temperature sensor may be configured to detect a temperature proximate one of the charging circuit or the heat sink. A controller may be operable to receive a signal indicative of the temperature of the battery charger from the charger temperature sensor and a signal indicative of the temperature of the battery from a battery temperature sensor.

The housing may define an air inlet and an air outlet, the battery charger may further include a tubular heat sink operable to dissipate heat in the housing, and the fan may be operable to cause air flow from the air inlet to the air outlet and along the heat sink. The heat sink may define a flow path, and the fan may be operable to cause the air flow to flow through the flow path. The flow path may have a path inlet and a path outlet, and the fan may be positioned between the path outlet and the air outlet.

The battery charger may include a baffle between the path outlet and the fan. The heat sink may include a plurality of tubes defining a plurality of flow paths. Air may flow in a first direction along one of the flow paths, and air may flow in a second direction along another one of the flow paths, the second direction being different than the first direction. The heat sink including the plurality of tubes may be formed as a unitary piece.

The charging circuit may be electrically connectable to a power source and may include a charger terminal electrically connectable to a battery terminal of the battery. The battery charger may include a first switch operable to electrically connect the charging circuit to the power source when the battery engages the battery charger and a second switch operable to electrically connect the charging circuit to the battery terminal after the charger terminal is electrically connected to the battery terminal. The first switch and the second switch may be supported on the housing and operable through engagement with the battery.

The first switch and the second switch may be arranged on the housing such that, during coupling of the battery to the battery charger, the first switch is engaged by the battery before the second switch. The second switch may be supported on the housing such that, during removal of the battery from the battery charger, the second switch is disengaged before the battery terminal disengages the charger terminal.

In yet another independent embodiment, a method of operating a battery charger may be provided, the battery charging including a housing, a fan positioned within the housing, and a charging circuit positioned within the housing and operable to output a charging current to charge a battery couplable to the battery charger, the battery including a battery housing and battery cells supported by the battery housing. The method may generally include sensing a temperature of the battery charger; sensing a temperature of the battery; and adjusting the charging current or a fan speed based on at least one of the temperature of the battery charger or the temperature of the battery.

The battery charger may further include a tubular heat sink and a sensor positioned proximate one of the charging circuit and the heat sink, and sensing a temperature of the battery charger may include sensing a temperature proximate one of the charging circuit or the heat sink. The battery may include a sensor, and sensing a temperature of the battery may include sensing a temperature of the battery using the sensor of the battery.

The battery charger may include a controller and a first sensor for sensing the temperature of the battery charger, the battery may include a second sensor for sensing the temperature of the battery, and the method may further include receiving, with the controller, a signal indicative of the temperature of the battery charger from the first sensor and a signal indicative of the temperature of the battery from the second sensor.

The charging circuit may be electrically connectable to a power source and may include a charger terminal electrically connectable to a battery terminal, and the method may further include operating a first switch to electrically connect the charging circuit to the power source; and after the charger terminal is electrically connected to the battery terminal, operating a second switch to electrically connect the charging circuit to the battery terminal.

Operating the first switch may include engaging the battery with the first switch to operate the first switch, and operating the second switch may include engaging the battery with the second switch to operate the second switch. During coupling of the battery to the battery charger, operating the second switch may occur after operating the first switch. During removal of the battery from the battery charger, the second switch may be disengaged before the battery terminal is disengaged from the charger terminal. The battery charger may further include a controller, and disengaging the second switch may include transmitting a signal to the controller.

The housing may define an air inlet and an air outlet, the battery charger may include a tubular heat sink, and the method may further include causing air flow, by the fan, from the air inlet to the air outlet and along the heat sink. The heat sink may define a flow path, and causing air flow may include causing air flow through the flow path. The flow path may have a path inlet and a path outlet, the fan may be positioned between the path outlet and the air outlet, the battery charger may further include a baffle between the path outlet and the fan, and causing air flow further may include causing air flow through the baffle before the air flow exits the housing through the air outlet.

The heat sink may include a plurality of tubes defining a plurality of flow paths, and causing air flow may include causing air flow through each of the flow paths. Causing air flow includes causing air flow in a first direction along one of the flow paths, and causing air flow in a second direction along another one of the flow paths, the second direction being different than the first direction.

Other independent aspects of the invention will become apparent by consideration of the detailed description and accompanying drawings.

BRIEF DESCRIPTION OF THE DRAWINGS

FIG. 17 is a front view of the battery shown in FIG. 14.

FIG. 18 is a rear view of the battery shown in FIG. 14.

DETAILED DESCRIPTION

Figure 1:
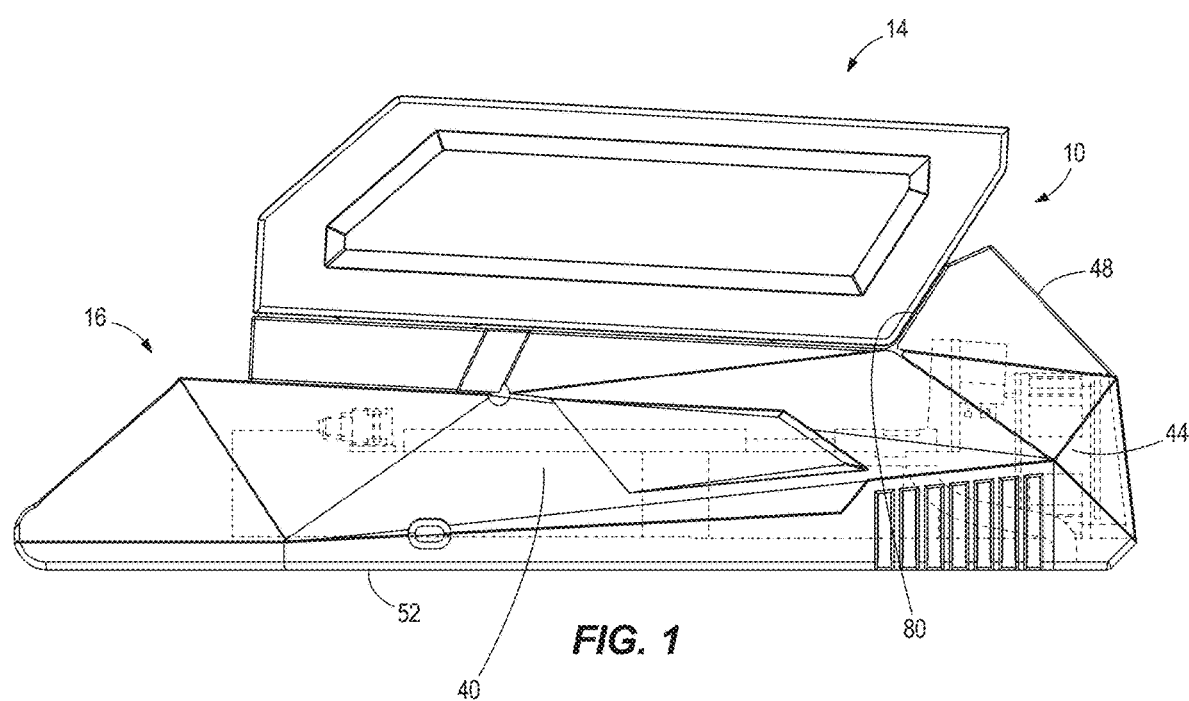
FIG. 1 is a side view of a battery coupled to a battery charger illustrating a portion of the charger housing as transparent.

Before any independent embodiments of the invention are explained in detail, it is to be understood that the invention is not limited in its application to the details of construction and the arrangement of components set forth in the following description or illustrated in the following drawings. The invention is capable of other independent embodiments and of being practiced or of being carried out in various ways.

Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

Relative terminology, such as, for example, "about", "approximately", "substantially", etc., used in connection with a quantity or condition would be understood by those of ordinary skill to be inclusive of the stated value and has the meaning dictated by the context (for example, the term includes at least the degree of error associated with the measurement of, tolerances (e.g., manufacturing, assembly, use, etc.) associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10% or more) of an indicated value.

Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not listed.

Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

Many of the modules and logical structures described are capable of being implemented in software executed by a microprocessor or a similar device or of being implemented in hardware using a variety of components including, for example, application specific integrated circuits ("ASICs"). Terms like "controller" and "module" may include or refer to both hardware and/or software. Capitalized terms conform to common practices and help correlate the description with the coding examples, equations, and/or drawings. However, no specific meaning is implied or should be inferred simply due to the use of capitalization. Thus, the claims should not be limited to the specific examples or terminology or to any specific hardware or software implementation or combination of software or hardware.

FIG. 1 illustrates a battery charger 10 operable to charge a battery 14 coupled to the charger 10. In the illustrated construction, the battery 14 includes a high power battery pack (e.g., having a nominal voltage of at least about 80 volts (V)) connectable to and operable to power various motorized power tools (e.g., a cut-off saw, a miter saw, a table saw, a core drill, an auger, a breaker, a demolition hammer, a compactor, a vibrator, a compressor, a drain cleaner, a welder, a cable tugger, a pump, etc.), outdoor tools (e.g., a chain saw, a string trimmer, a hedge trimmer, a blower, a lawn mower, etc.), other motorized devices (e.g., vehicles, utility carts, a material handling cart, etc.), etc. and non-motorized electrical devices (e.g., a power source, a light, an AC/DC adapter, a generator, etc.).

Figure 7:
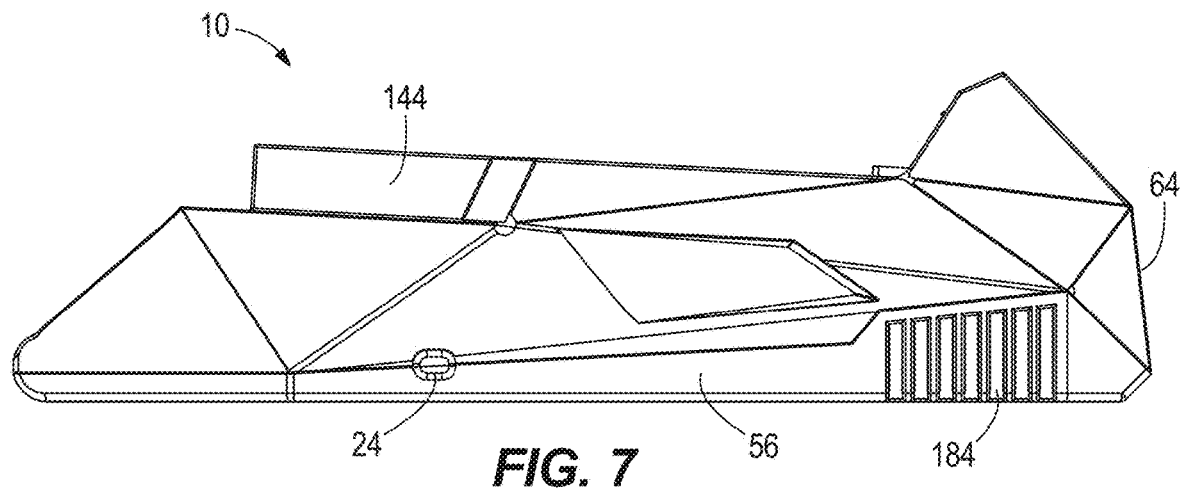
FIG. 7 is a first side view of the charger shown in FIG. 1.
Figure 8:
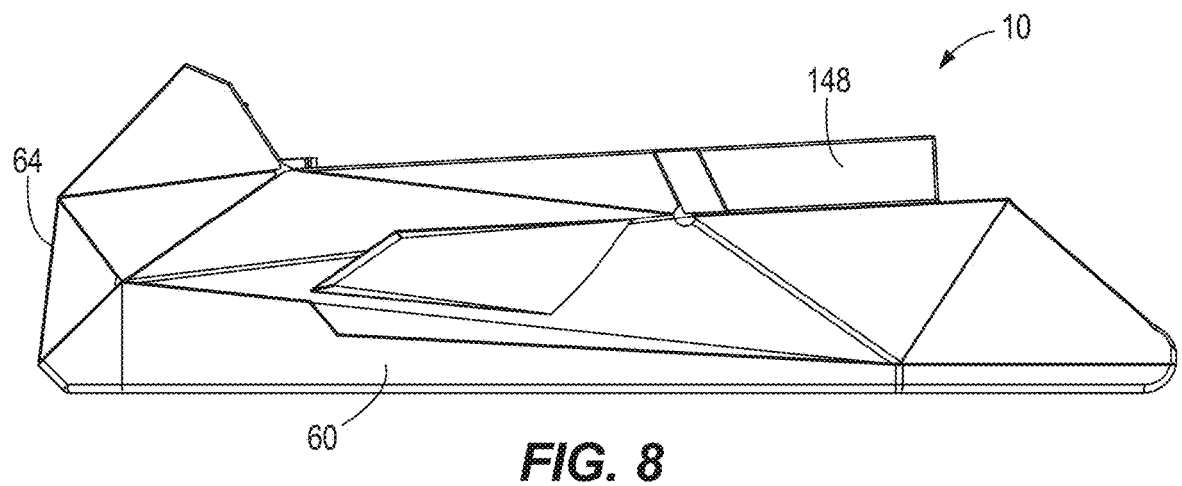
FIG. 8 is a second view of the charger shown in FIG. 1.

The charger 10 includes a housing 16 providing support structure 18 engageable with the battery 14, a charger terminal block 20 (FIG. 2) electrically connectable to the battery 14, a power input port 24 (FIG. 7) for connection to a power source (e.g., through a power cord), charger electronics 28 (FIG. 9), and a circuit 32 (FIG. 27) connecting the port 24, the electronics 28 and the terminal block 20. The charger electronics 28 and the circuit 32 may be defined as a charging circuit electrically connectable to the power source. At least a portion of the charging circuit is positioned within the housing 16 of the battery charger 10. As discussed below in more detail, the charger 10 further includes a heat dissipating structure 36 (FIG. 9) including a heat sink 40 and a fan 44.

As shown in FIGS. 2-9, the charger housing 16 includes a top portion 48 coupled to a bottom portion 52. The housing 16 has opposite sides 56, 60, a back wall 64, a front wall 68, a bottom 72 and a top 76 forming the charger 10. The top 76 provides the support structure 18 for the battery 14, as further discussed below, and has a back wall 80.

Figure 2:
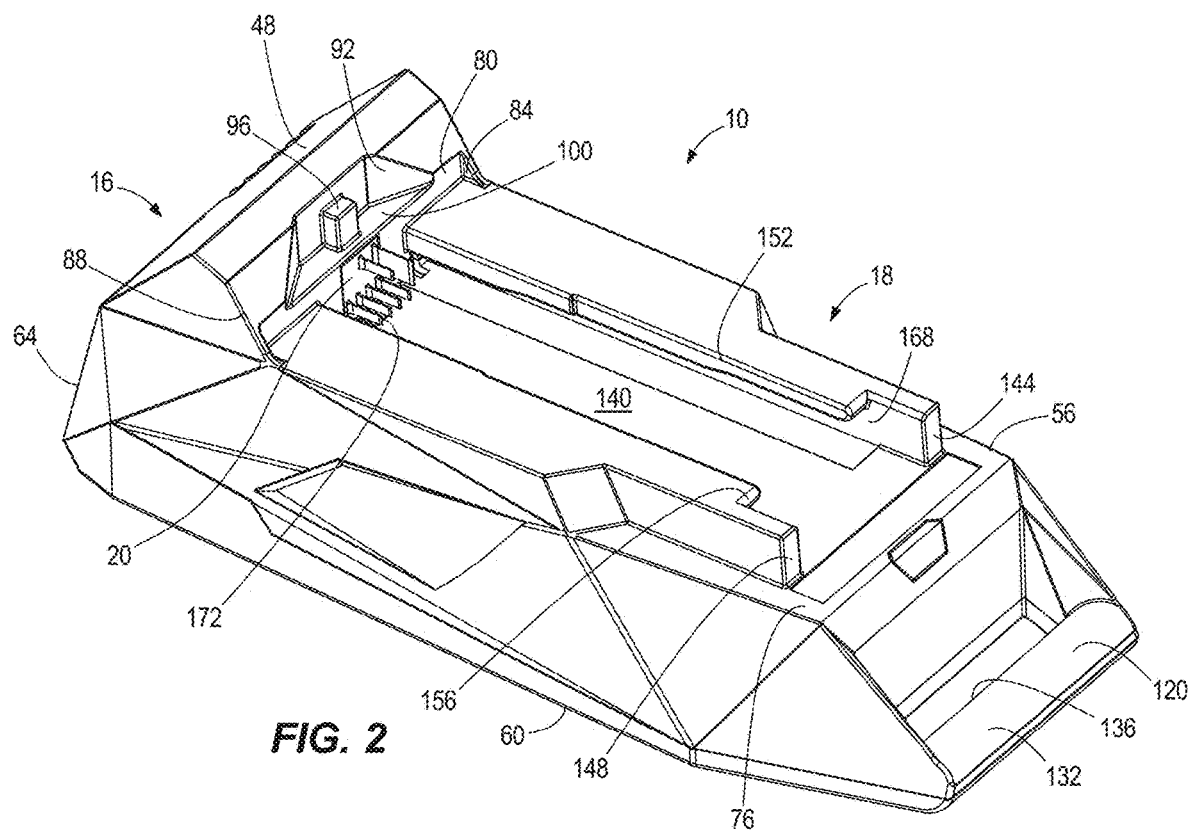
FIG. 2 is a perspective view of the charger shown in FIG. 1.
Figure 3:
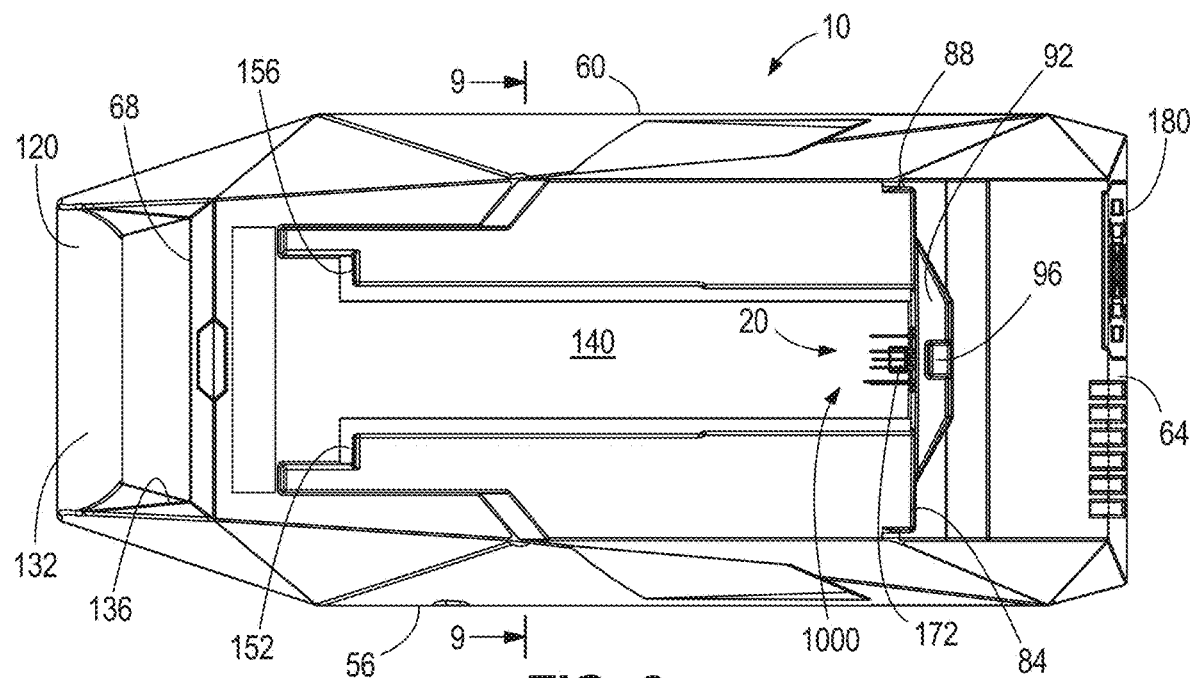
FIG. 3 is a top view of the charger shown in FIG. 1.

As shown in FIGS. 2-3, the back wall 80 protrudes upwardly on the top 76 and extends generally the width of the charger 10. The back wall 80 has opposite ends 84, 88 and defines a shelf 92. The terminal block 20 is supported on the back wall 80 between the ends 84, 88, and is positioned below the shelf 92. As discussed below in more detail, the charger terminal block 20 includes terminals 1000 (FIG. 3) operable to electrically connect the battery 14 and the charger 10.

The shelf 92 is positioned above the terminal block 20 and has a protrusion 96. The shelf 92 on its bottom surface 100. The illustrated protrusion 96 is cuboidal in shape; however, in other embodiments, the protrusion 96 may have another shape, such as a rectangular prism, a triangular prism, etc. As discussed below in more detail, the protrusion 96 is engageable with a portion of the battery 14.

Figure 4:
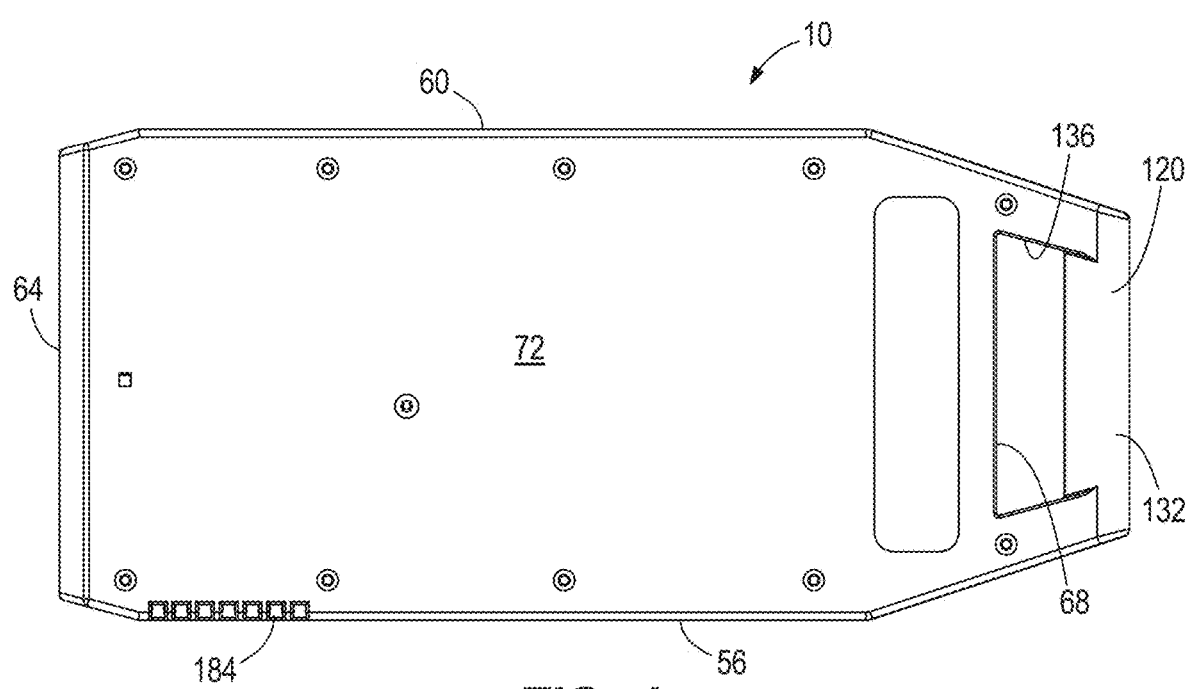
FIG. 4 is a bottom view of the charger shown in FIG. 1.
Figure 5:
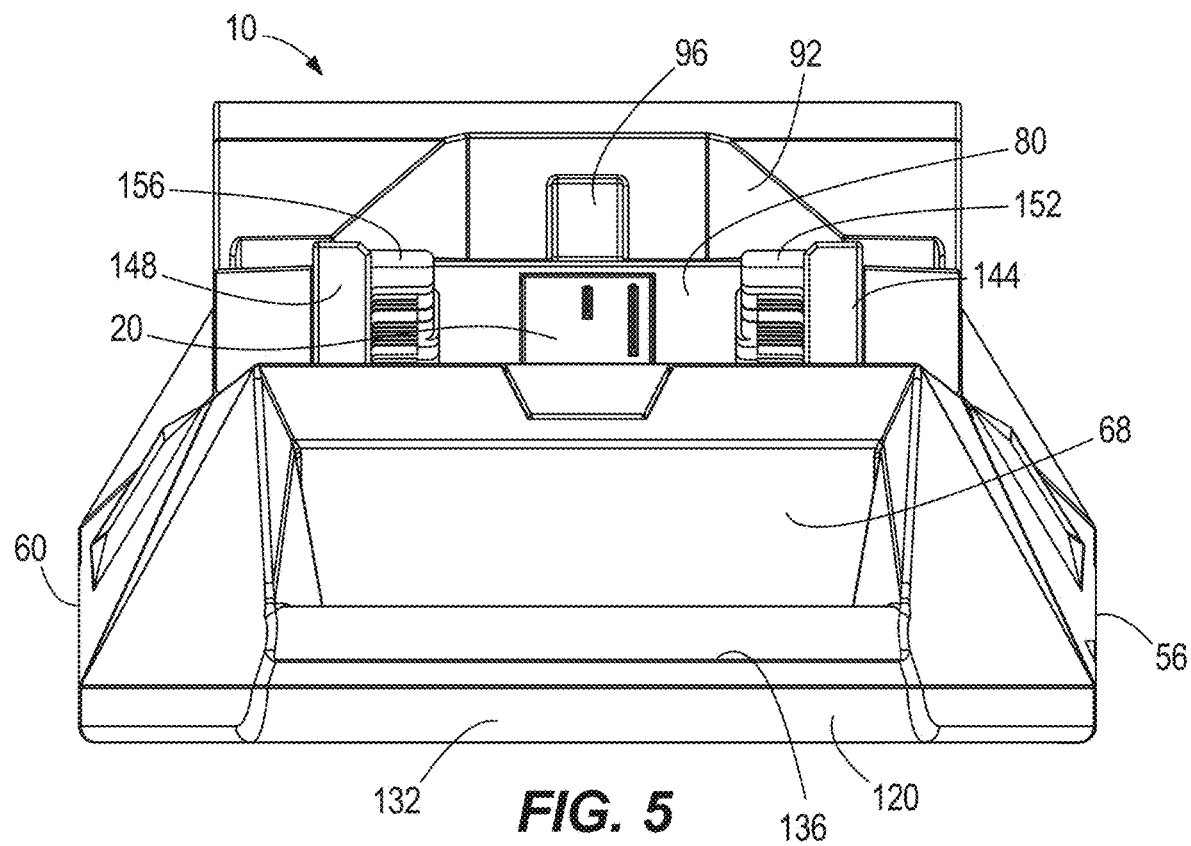
FIG. 5 is a front view of the charger shown in FIG. 1.

As shown in FIGS. 3-4, a handle 120 is formed on the front side 68 of the housing 16. The handle 120 includes a grip member 132 extending across the front side 68 of the housing 16. A gap 136 is provided between the connecting member 132 and the front side 68 to accommodate a user's fingers to carry the charger 10 with or without a connected battery 14.

As best illustrated in FIGS. 2-3, the support structure 18 includes a base surface 140 with a first rail 144 and an opposite second rail 148 spaced from the base surface 140. The back wall 80 extends upwardly from the base surface 140. The rails 144, 148 are generally parallel and include an inner face 168. A groove 152, 156 is defined between the base surface and the associated rail 152, 156. The rails 144, 148 and grooves 152, 156 are engageable with corresponding structure on the battery 14.

As shown in FIGS. 2-3 and 9-10, a stepped configuration is provided on each rail 144, 148 along the axis and between the rails 144, 148. Similar support structure is disclosed and illustrated in U.S. Provisional Patent Application Nos. 62/435,443, filed Dec. 16, 2016, and 62/463,427, filed Feb. 24, 2017, and in U.S. patent application Ser. No. 15/845,063, filed Dec. 18, 2017, the entire contents of all of which are hereby incorporated by reference.

A button 172 (see FIG. 21B) is positioned below the terminal block 20 proximate the back wall 80. A top surface 176 of the button 172 slants upwards from the support surface 140. The button 172 is biased to extend upwardly from the support surface 140 to a first extended position (FIG. 21B). The battery 14 is configured to engage and move the button 172 to a second depressed position generally flush with the support surface 140. Furthermore, the button 172 is associated with a DC micro switch 610 (see FIG. 27), as further discussed below.

Figure 6:
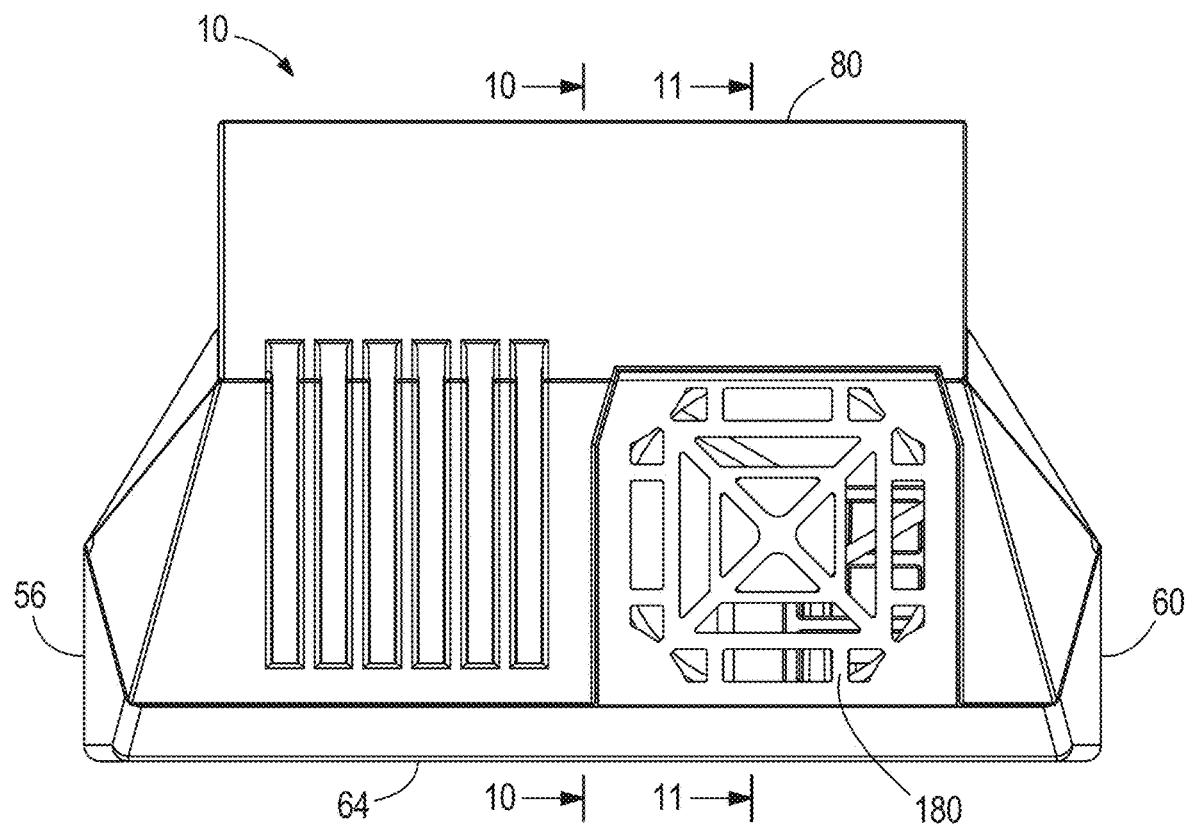
FIG. 6 is a rear view of the charger shown in FIG. 1.
Figure 29:
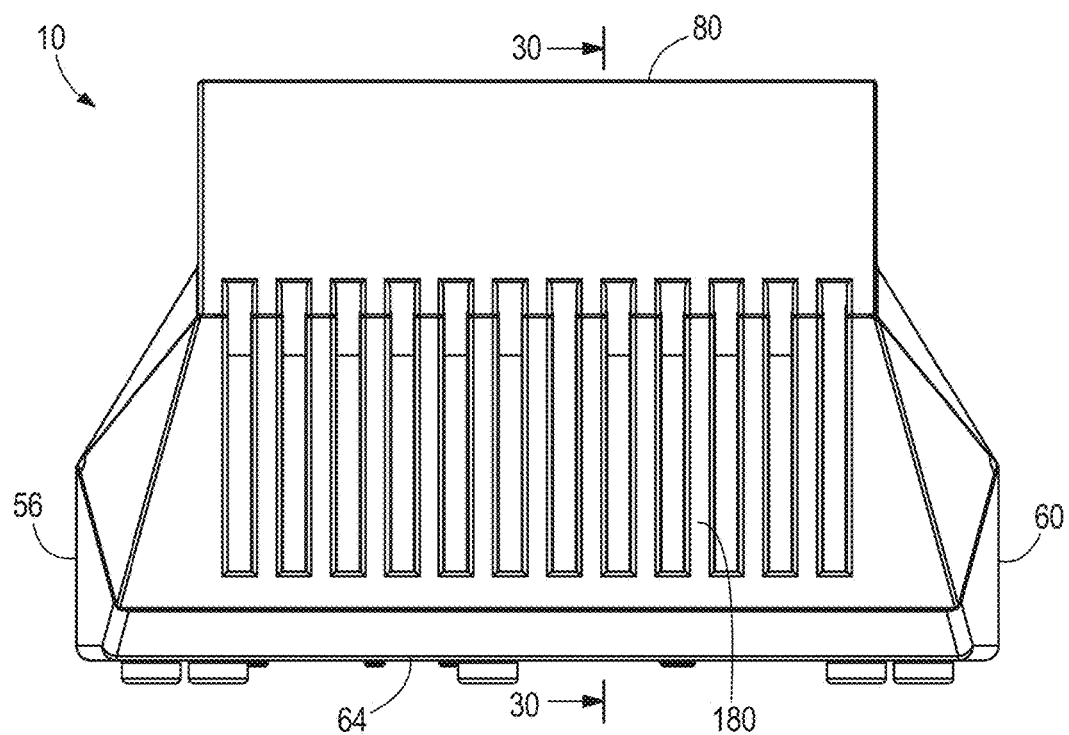
FIG. 29 is a rear view of the charger shown in FIG. 28.
Figure 30:
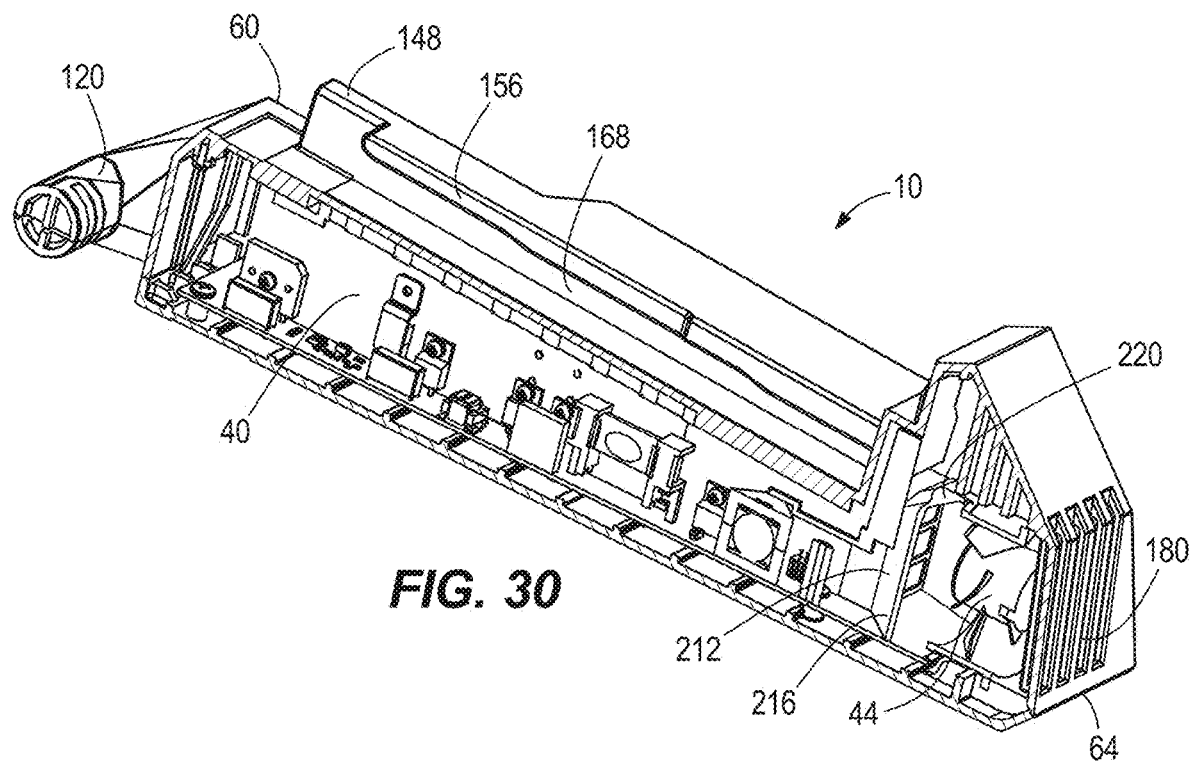
FIG. 30 is a side cross-sectional view of the charger shown in FIG. 28.

As shown in FIG. 6, the housing 16 defines an outlet 180 (e.g., on the back wall 64) and an inlet 184 (e.g., on the side 56). Fluid A (e.g., air, etc.) flows between the inlet 184 and the outlet 180 through the housing 16. In the other embodiments (not shown), the outlet 180 and the inlet 184 may be formed on different locations on the housing 16. The housing 16 may define more than one inlet 184 and/or more than one outlet 180. Furthermore, the outlet 180 may be formed by slots in the housing, in which the slots may have any shape, such as, rectangular, triangular, trapezoidal, etc. For example, FIG. 6 illustrates the outlet 180 formed by rectangular, triangular, and trapezoidal slots. FIG. 29 illustrates the outlet 180 formed by generally rectangular slots.

Figure 9:
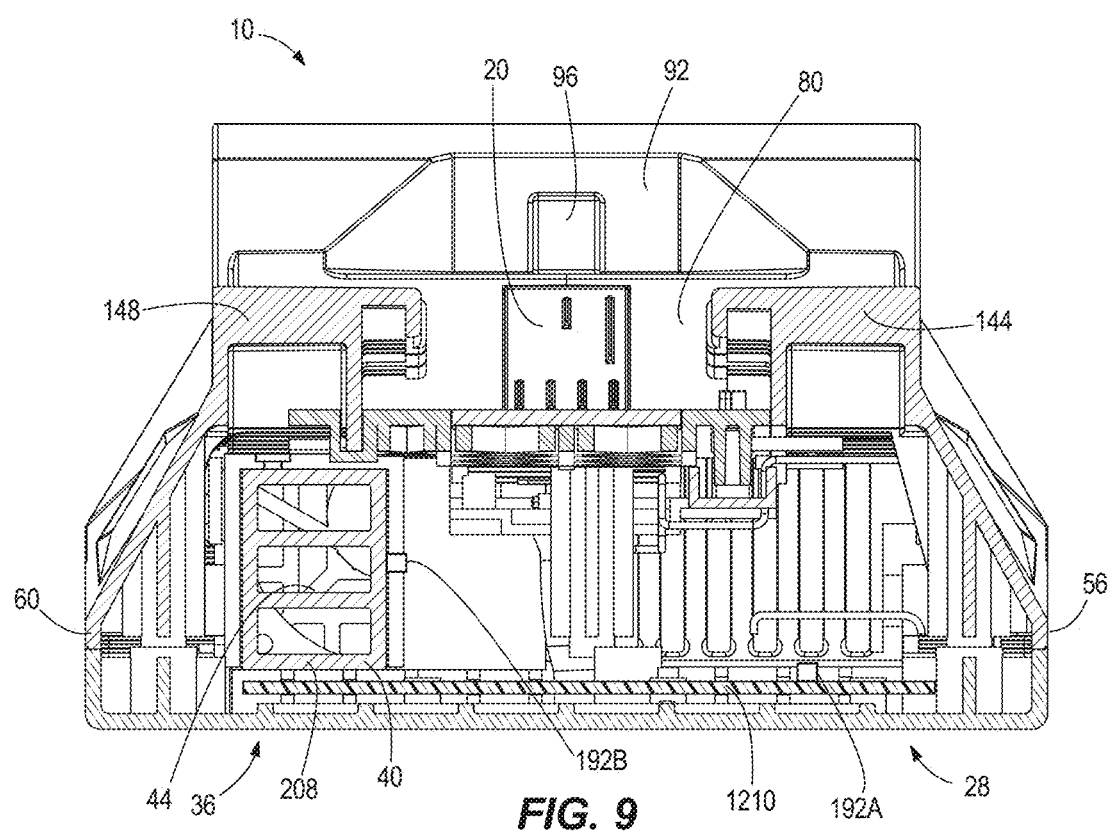
FIG. 9 is a front cross-sectional view of the charger shown in FIG. 1.
Figure 23:
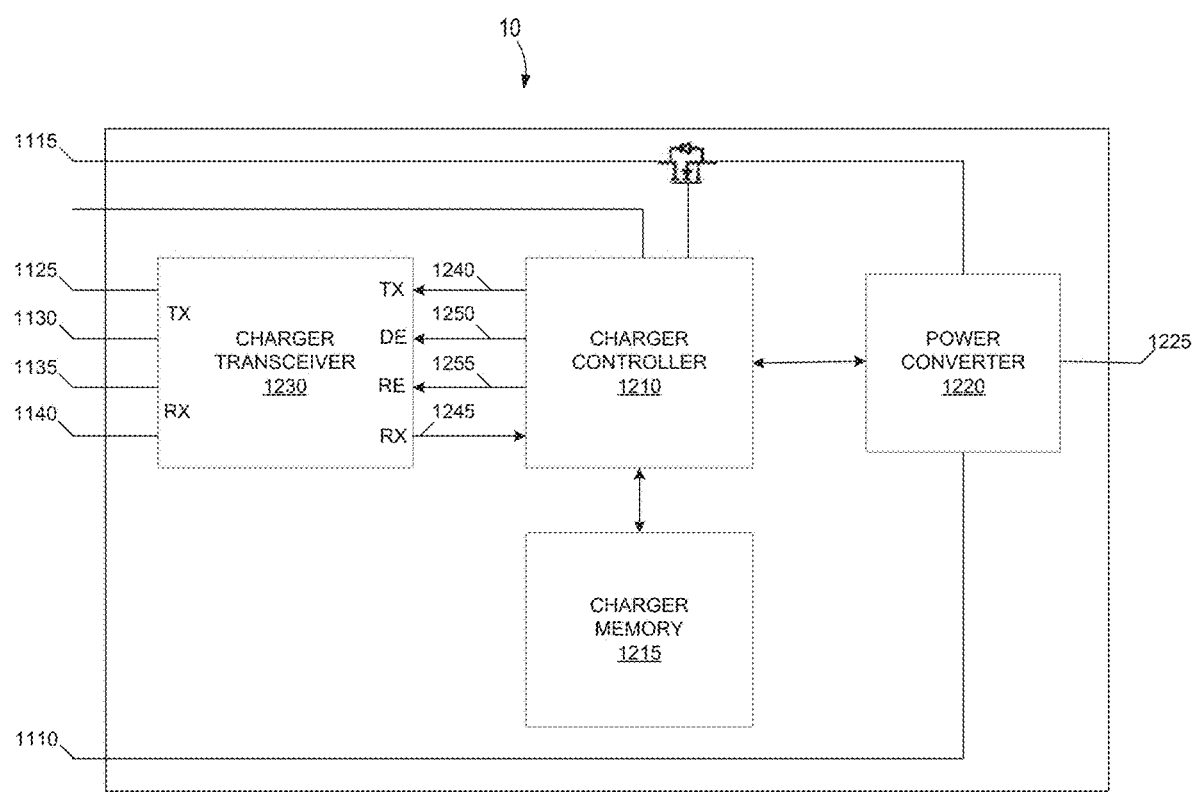
FIG. 23 is a block diagram of the charger shown in FIG. 1.
Figure 24:
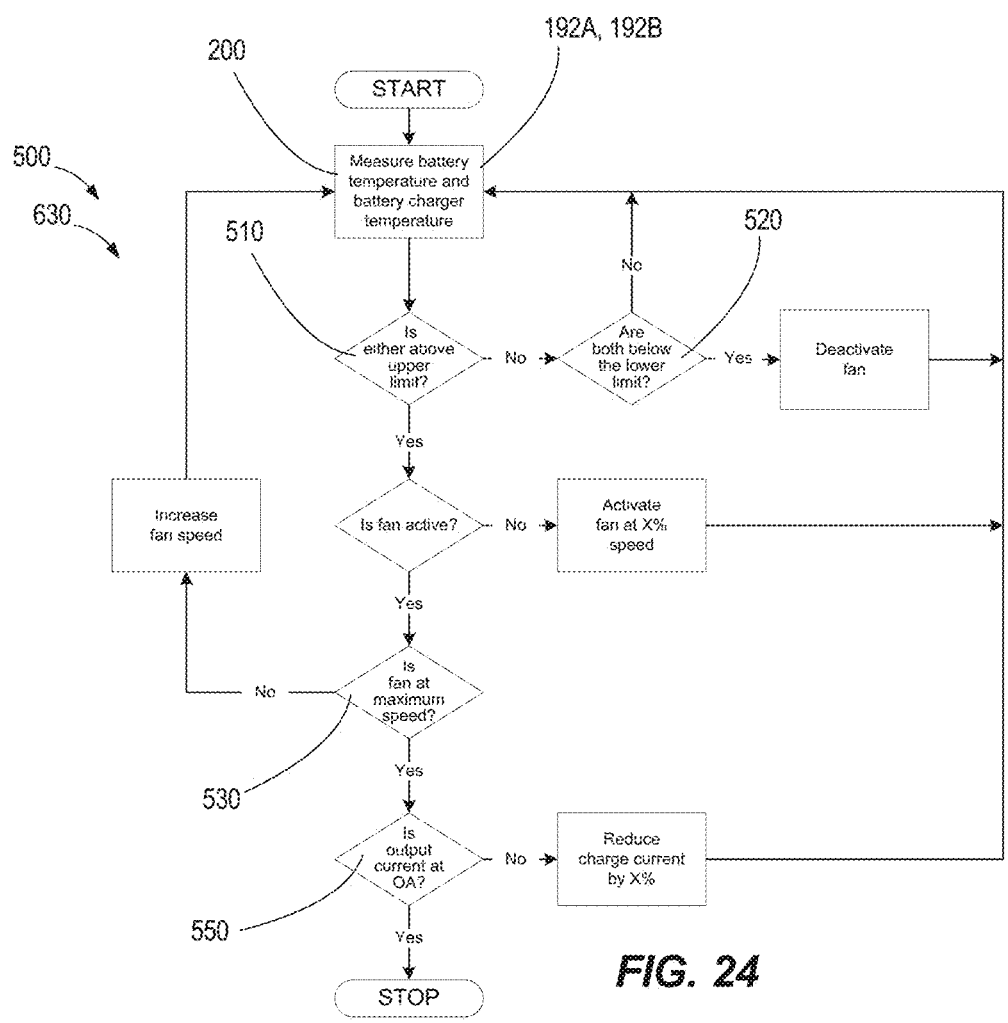
FIG. 24 is a flow chart illustrating a control process for adjusting charging current and fan speed based on temperature of the battery charger and the battery.

The charger electronics 28 (i.e., the charging circuit) is operable to output a charging current to the battery 14 to charge the battery 14. The charger electronics 28 include, among other things, a charger microcontroller 1210 (e.g., provided on a printed circuit board (PCB); FIGS. 9 and 23) and a temperature sensor 192 is disposed in the housing 16 positioned near the charger electronics 28 (e.g., near the component(s) generating the most heat (e.g., the CPU, a transformer, FETs, etc.)) or the heat sink 40. For example, in the illustrated embodiment (see FIG. 9), a temperature sensor 192A is mounted on the PCB, and a temperature sensor 192B is mounted to the heat sink 40. Each temperature sensor 192A, 192B (FIG. 9) is configured to detect a temperature of the charger 10 (e.g., of the electronics 28, the heat sink 40, etc.). In other embodiments, the charger 10 includes either temperature sensor 192A, 192B (FIG. 31) such that the temperature of the charger electronics 28 or the heat sink 40 is detected by the provided temperature sensor 192A, 192B.

The battery 14 also includes a temperature sensor 200 (FIG. 26) communicating with the microcontroller 1210. The temperature sensor 200 is configured to detect a temperature of the battery 14 and transmit a signal indicative of the battery temperature to the charger microcontroller 1210.

The charger terminal block 20 includes male terminals 1000 which extend from the back wall 80 of the housing 16 of the charger 10, as best shown in FIG. 9. The terminals 1000 include (see FIGS. 21A-21B) a row of communication (transmission/receiver) terminals separated from a row of power terminals. A similar terminal block is disclosed and illustrated in U.S. Provisional Patent Application No. 62/475,951, filed Mar. 24, 2017, the entire contents of which is hereby incorporated by reference.

Figure 21A:
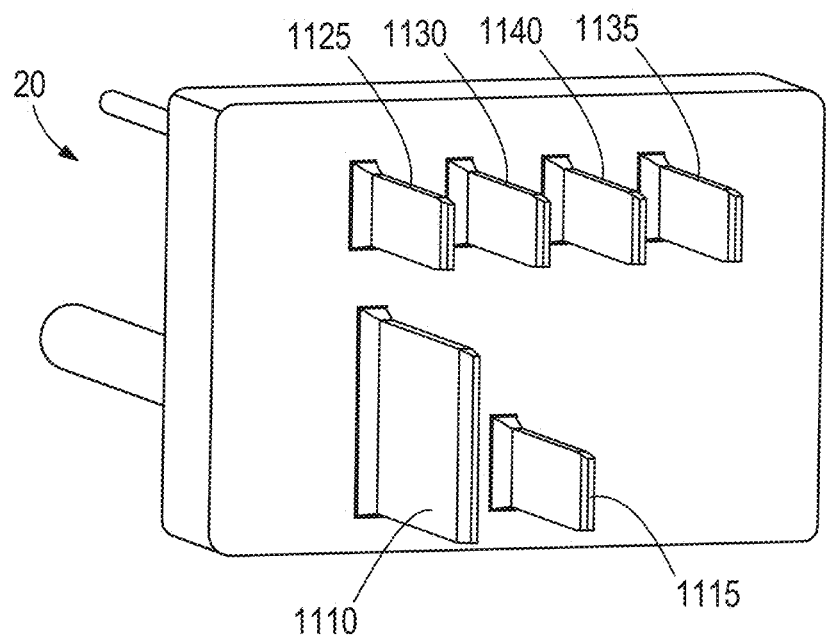
FIGS. 21A-21B are views of a charger terminal block.
Figure 21B:
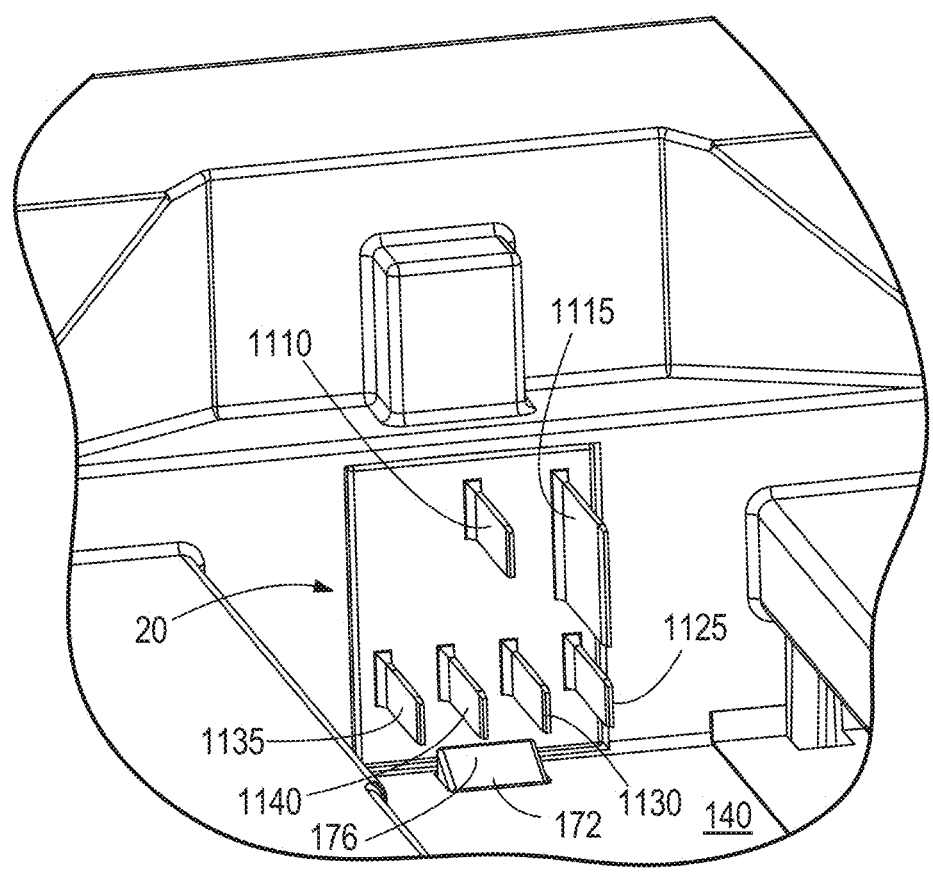
Figure 22:
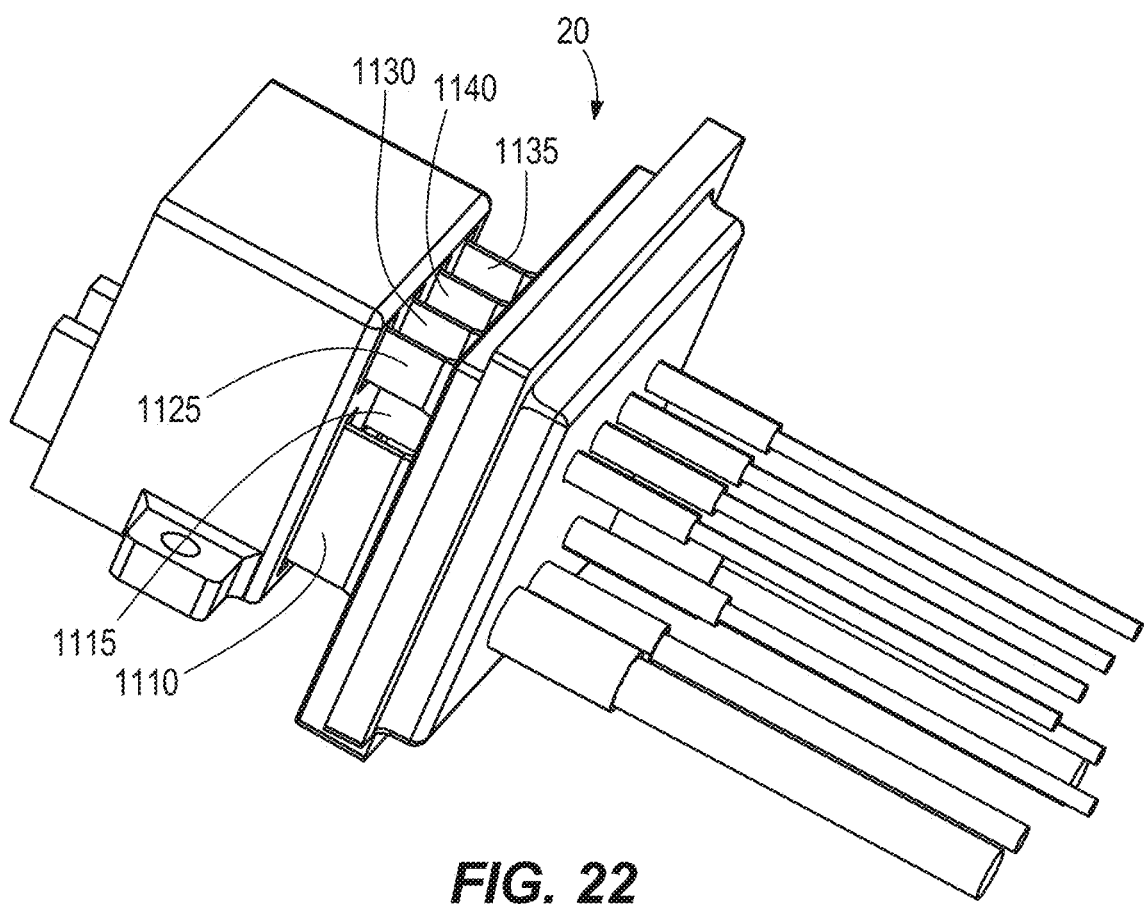
FIG. 22 is a perspective view of the charger terminal block shown in FIG. 20 electrically connected to a battery terminal block.

With reference to FIGS. 21A-21B, the power terminals include a ground terminal 1110 and a charger terminal 1115 couplable to the female terminals of the battery 14 to provide power to charge battery cells (not shown). The communication terminals include a positive transmission terminal 1125, a negative transmission terminal 1130, a positive receiver terminal 1135, and a negative receiver terminal 1140. The communication terminals allow for differential communication between the battery 14 and the charger 10.

The illustrated charger communication terminals 1125-1140 are only used to either receive or transmit data but not both. In other embodiments, the charger communication terminals follow a full-duplex standard (for example, RS485 standard). The communication terminals allow information (e.g., temperature, voltage, fault condition, etc.) for the battery 14 to be transmitted between the battery 14 to the charger microcontroller 1210. As discussed below in more detail, this information may be used to control operation of the charger 10 (e.g., to adjust a speed of the fan 44 and/or a charging current).

Figure 27:
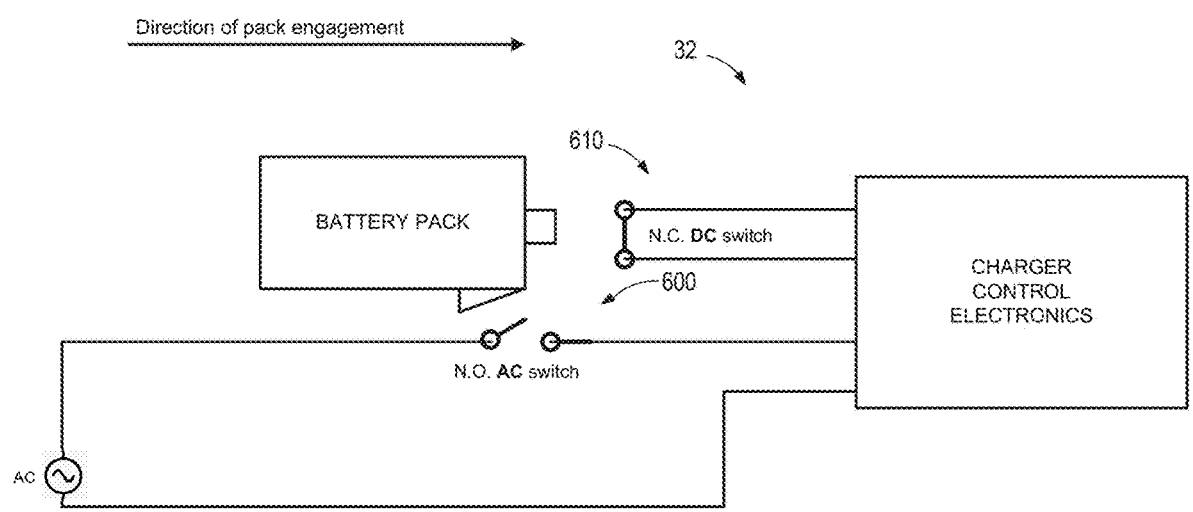
FIG. 27 is a schematic diagram illustrating engagement of the battery and the battery charger shown in FIG. 1.
Figure 28:
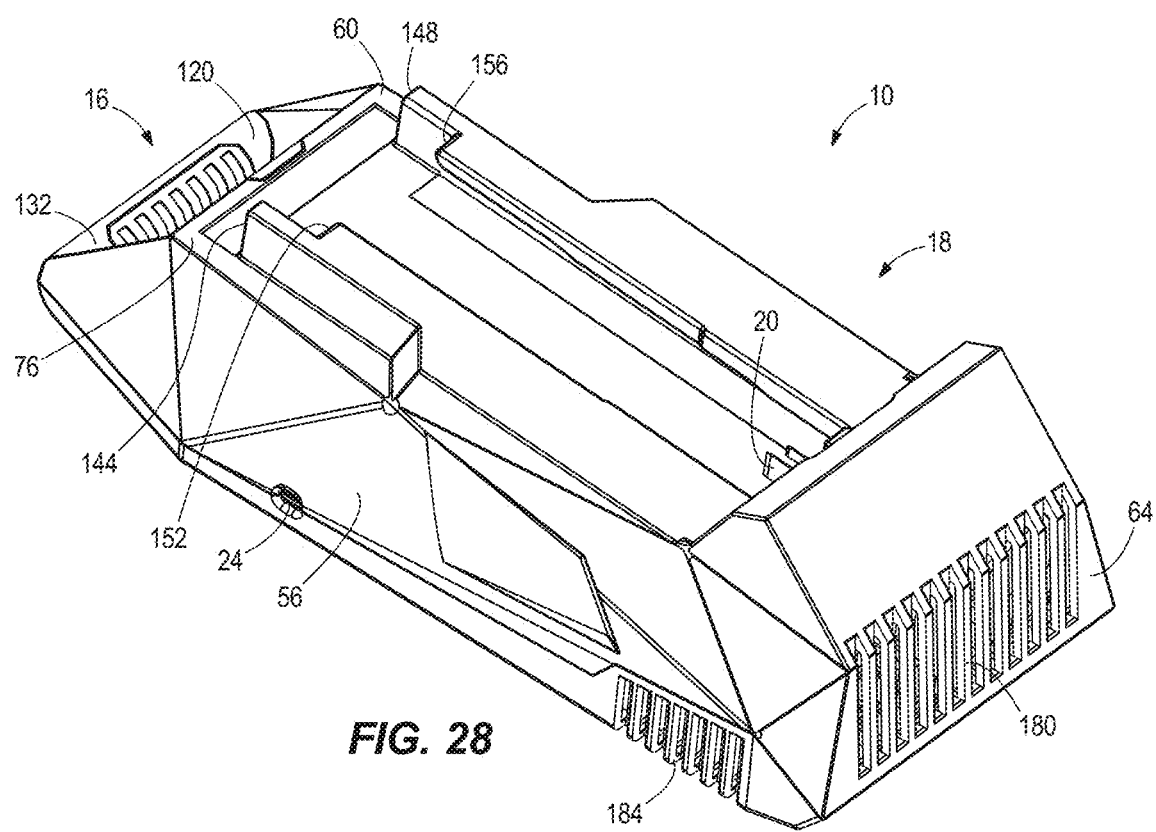
FIG. 28 is a perspective view of another charger embodying the invention.

As shown in FIG. 27, the illustrated circuit 32 includes an AC micro switch 600 and a DC micro switch 610 operable to establish power transfer for charging of the battery 14. In the illustrated construction, the battery 14 is configured to operate the switches 600, 610. In their initial positions, the switches 600, 610 are deactivated when the battery 14 is not coupled to the charger 10. Each switch 600, 610 includes an actuator (e.g., the button 172 for the switch 610) engageable by the battery 14 to activate the switch 600, 610.

In the illustrated embodiment, the AC micro switch 600 is in the circuit 32 between the power source and the microcontroller 1210, and the DC micro switch 610 is in the circuit 32 between the power source and the charger terminals 1000 (e.g., between the microcontroller 1210 and the charger power terminals 1110, 1115). The switches 600, 610 are supported on the housing 16 of the battery charger 10. The AC micro switch 600 is operable to electrically connect the charging circuit (e.g., charger electronics 28) to the power source when the battery 14 engages the battery charger 10. The DC micro switch 610 is operable to electrically connect the charging circuit (e.g., charger electronics 28) to the battery terminal 1150 after the charger terminal 1110, 1115 is electrically connected to the battery terminals, as further discussed below.

Figure 10:
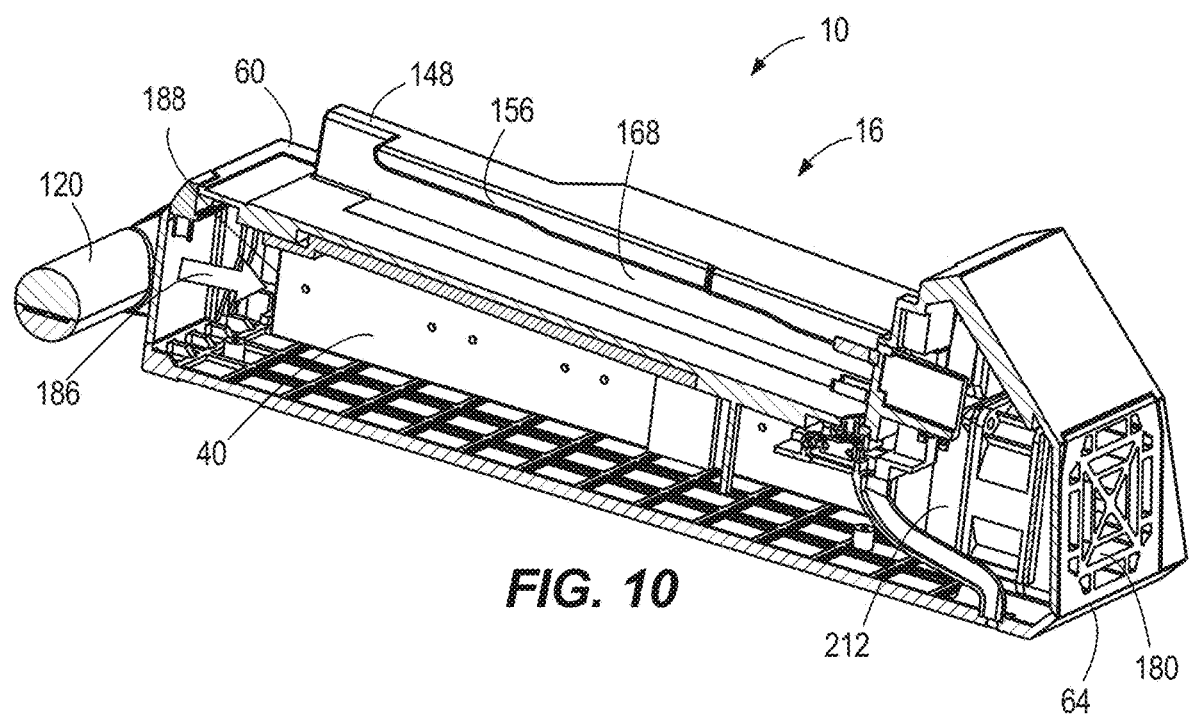
FIG. 10 is a side cross-sectional view of the charger shown in FIG. 1.
Figure 11:
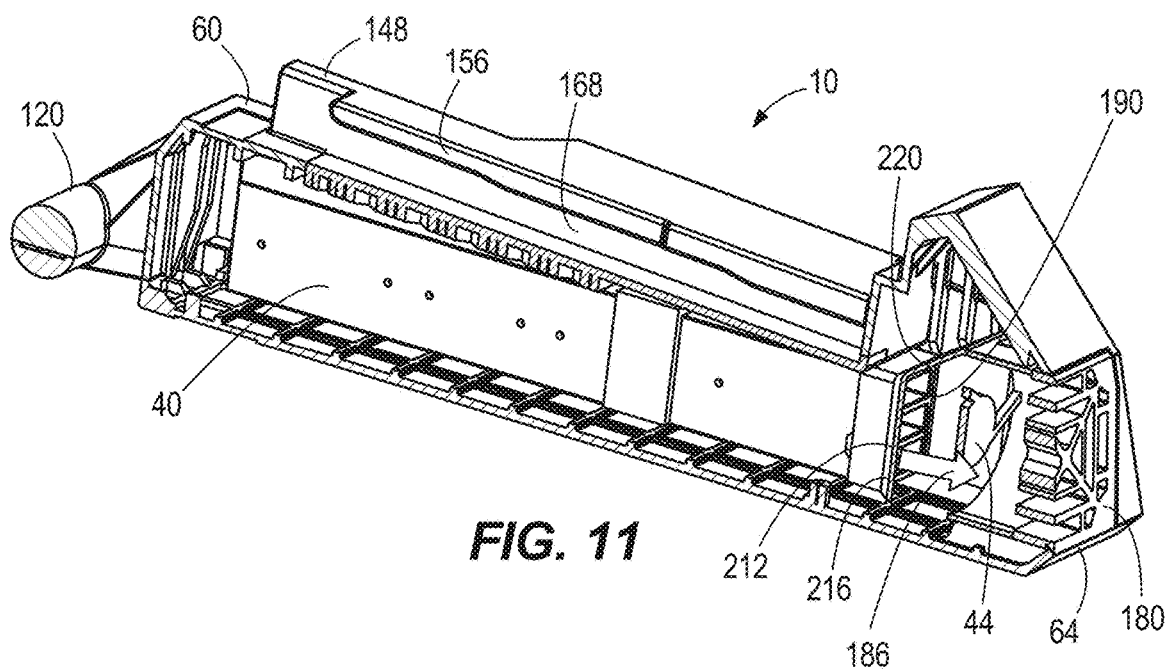
FIG. 11 is another side cross-sectional view of the charger shown in FIG. 1.

As shown in FIGS. 9-11, the heat dissipating structure includes the heat sink 40 and the fan 44. The heat sink 40 is disposed in the housing 16 and is generally positioned near the second side 60 and below the support surface 140 of the housing 16. In the illustrated construction, the heat sink 40 is in heat transfer relationship with components of the charger electronics 28 (e.g., is mounted onto and in contact with the charger electronics 28). In other words, heat transfers from the heat-generating components of the charger electronics 28 to the heat sink 40 through conduction. The heat sink 40 may be operable to dissipate heat in the housing 16 of the battery charger 10.

In the illustrated embodiment (see FIG. 9), the heat sink 40 is formed of heat-conducting material, such as, for example, aluminum, and constructed of one or more hollow tubes 208 (three shown). As such, the heat sink 40 forms a tubular heat sink 40. The illustrated heat sink 40 has multiple tubes 208 in which each tube 208 has a rectangular shape and is stacked above one another. As shown in FIG. 10, the inlet of the tubes 208 is angled toward the center of the housing 16. The hollow tube(s) 208 may have another shape, such as, for example, triangular, cylindrical, etc., and the heat sink 40 may have any number of tubes 208 (e.g., one, two, more than three). The illustrated heat sink 40, including the one or more tubes 208, is formed as a unitary piece. In other embodiments, the battery charger 10 may include two or more discrete heat sinks 40.

The heat sink 40 defines a flow path 186 having a path inlet 188 and a path outlet 190. As shown in FIGS. 10 and 11, the illustrated path inlet 188 is at one end of the heat sink 40 and the illustrated path outlet 190 is at the opposite end and proximate the air outlet 180. Furthermore, the adjacent tubes 208 of the heat sink 40 form a plurality of flow paths through which the fluid A may flow.

Figure 12:
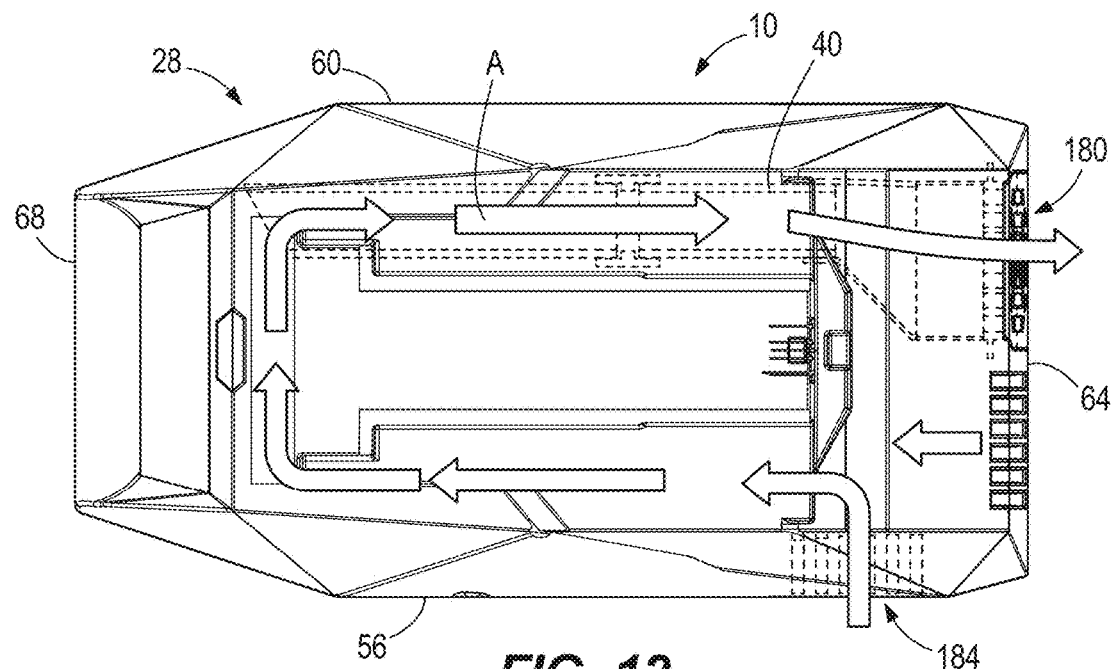
FIG. 12 is a top cross-sectional view of the charger shown in FIG. 1 illustrating a fluid flow path.
Figure 13:
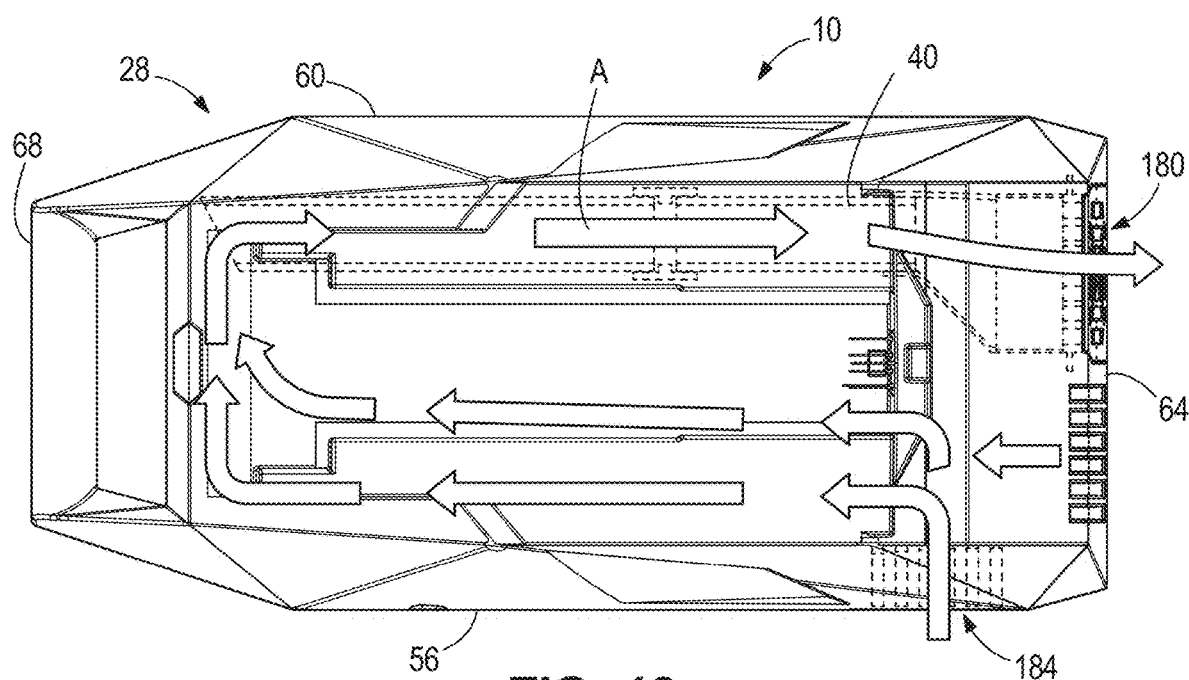
FIG. 13 is another top cross-sectional view of the charger shown in FIG. 1 illustrating an alternative fluid flow path.

In FIG. 12, two heat sinks 40 are provided, and the flow of fluid A is directed from the inlet 184, along and through the upstream heat sink 40, to, along and through the downstream heat sink 40 to the outlet 180. In the illustrated construction, each heat sink 40 includes a number of adjacent tubes 208 each having a different length. Alternatively, in FIG. 12, the battery charger 10 may include one heat sink 40 having adjacent tubes 208 in which the fluid A flows in a first direction along a first flow path defined by one of the tubes 208 and, subsequently, flows in a second direction along another flow path defined by an adjacent tube 208. The illustrated first and second directions are different (e.g., opposite). As such, in this construction, the path inlet is proximate the air inlet 184 and the path outlet 190 is proximate the air outlet 180. In FIG. 13, the flow of fluid A is directed in two paths—through the upstream heat sink 40 and across the charger electronics 28—to the downstream heat sink 40. The flow direction of the fluid A is in relatively the same direction through the upstream heat sink 40 and across the charger electronics 28 and in a different flow direction through the downstream heat sink 40.

With reference to FIGS. 10-11, the illustrated fan 44 is a multi-speed fan operable to rotate at more than one speed and directs the fluid A (e.g. air) from the inlet 184 through the tube(s) 208 of the heat sink(s) 40 and to the outlet 180. In the illustrated construction, the fan 44 is positioned in (see FIGS. 10-11) a baffle 212 formed in the housing 16 near the outlet 180, and the illustrated baffle 212 is coupled to one of the hollow tube(s) 208 of the heat sink 40. In other words, a conduit 216 forms the baffle 212, and the fan 44 is positioned between a first end 220 of the conduit 216 and the outlet 180 of the housing 16 (FIG. 11). As such, the illustrated fan 44 is positioned between the path outlet 190 and the air outlet 180. The fan 44 is operable to cause the fluid A to flow from the inlet 184 to the outlet 180 and along the heat sink 40. In addition, the fan 44 is operable to cause the fluid A to flow through the flow path 186. The baffle 212 is positioned between the path outlet 190 and the fan 44. The fluid A flows along the heat sink 40 through the path outlet 190 and the baffle 212 before exiting the housing 16 through the air outlet 180.

In other constructions, the fan 44 may be a single speed fan. In other embodiments (not shown), the fan 44 may be positioned in a different location (e.g., proximate the inlet 184) to direct fluid through the housing 16 and relative to the heat sink 40.

Figure 14:
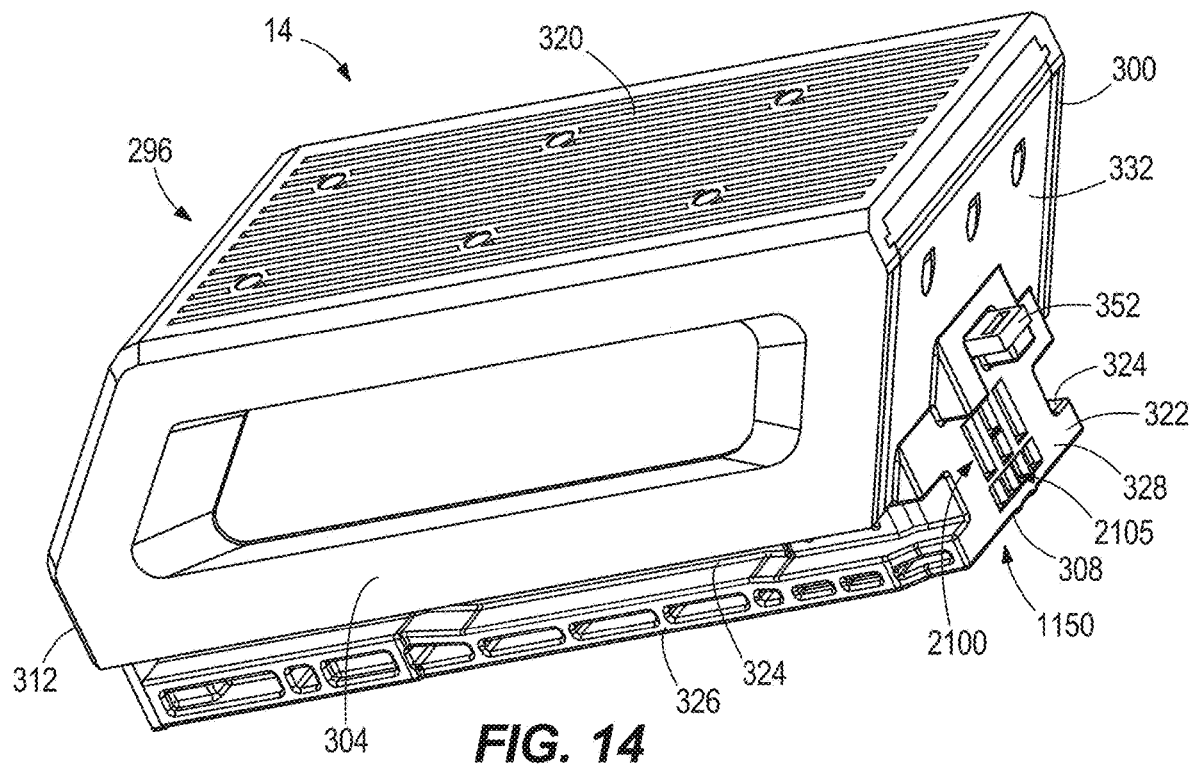
FIG. 14 is a perspective view of the battery shown in FIG. 1.
Figure 15:
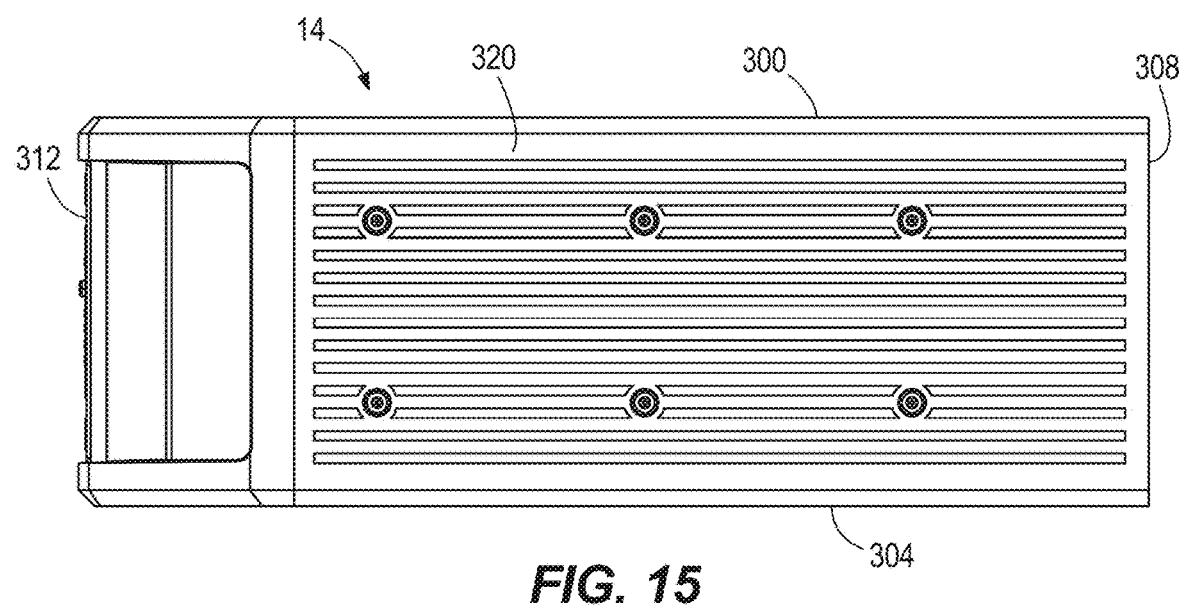
FIG. 15 is a bottom view of the battery shown in FIG. 14.
Figure 16:
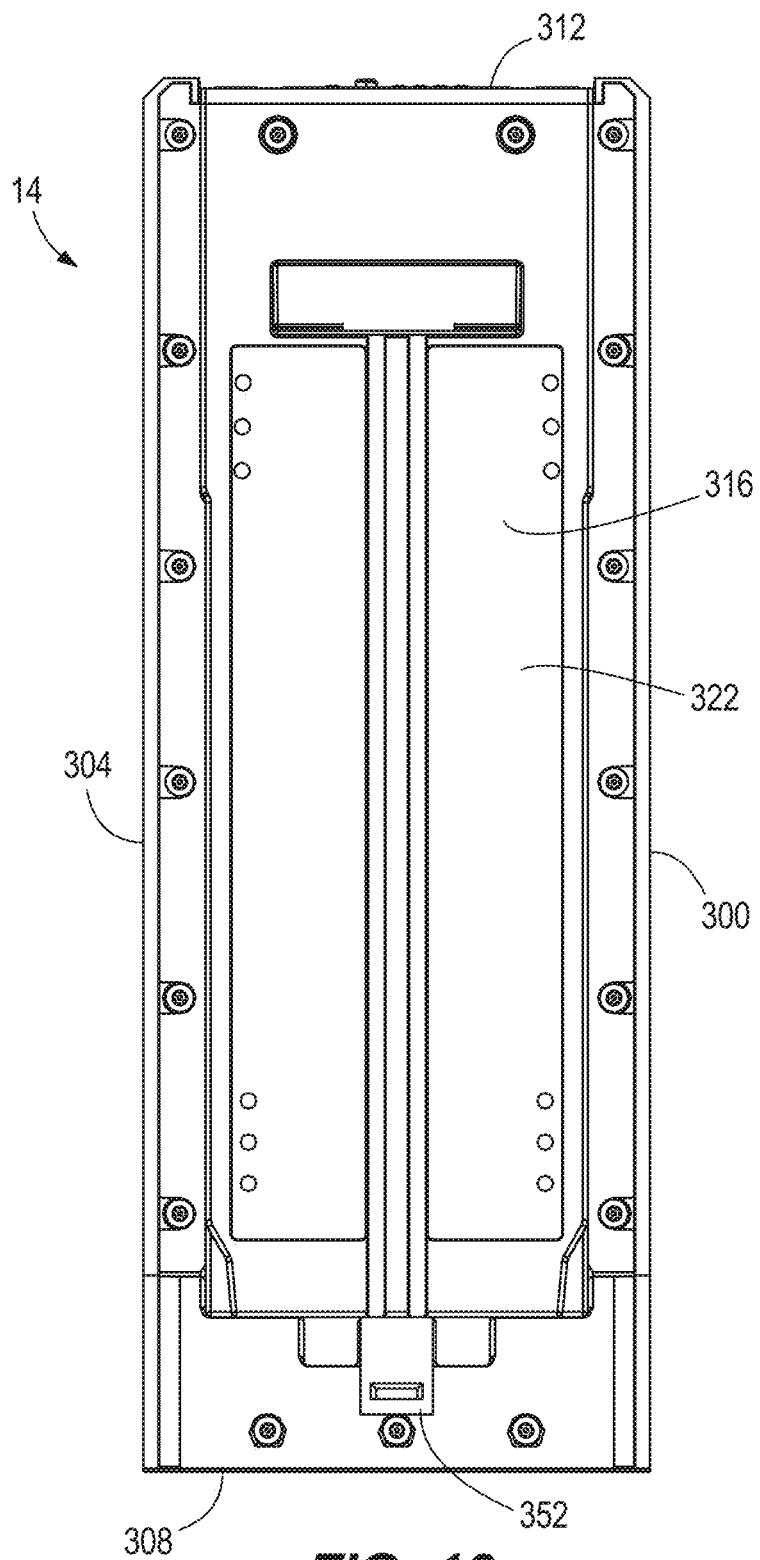
FIG. 16 is a top view of the battery shown in FIG. 14.
Figure 19:
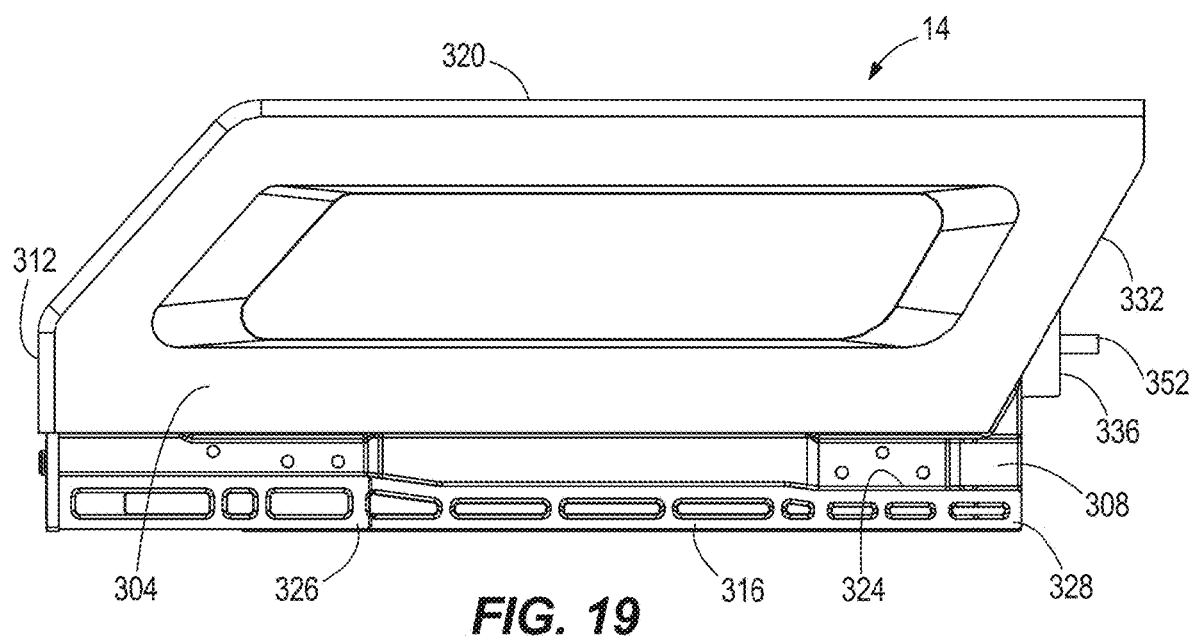
FIG. 19 is a first side view of the battery shown in FIG. 14.
Figure 20:
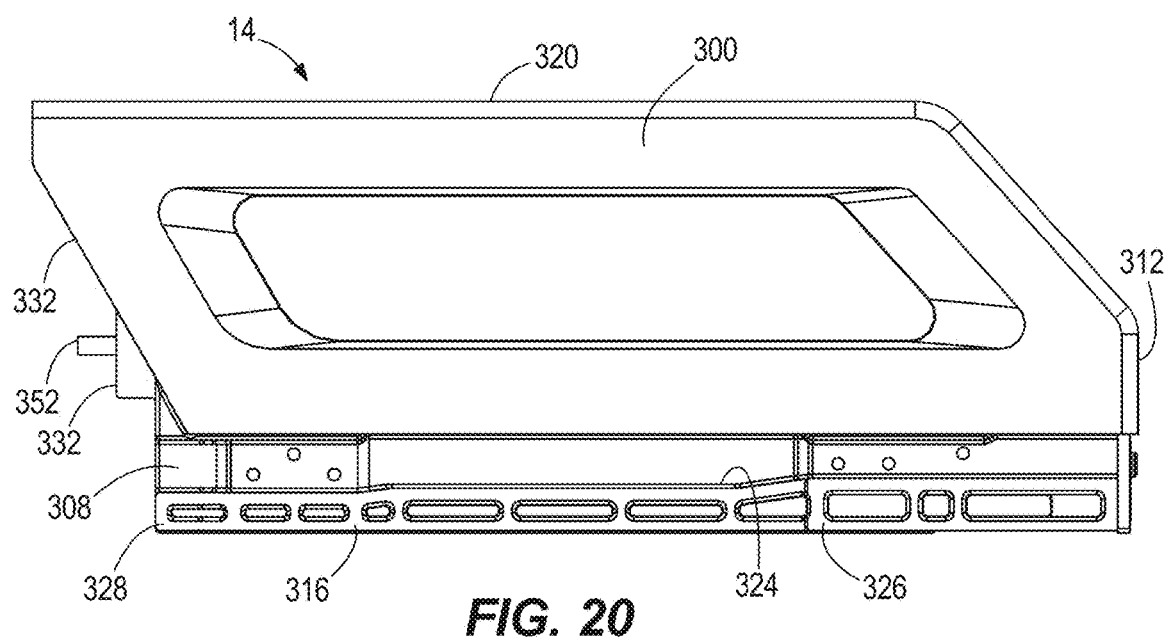
FIG. 20 is a second side view of the battery shown in FIG. 14.

As shown in FIGS. 14-20, the battery 14 includes a housing 296 having opposite sides 300, 304, a front 308, a back 312, a bottom 316 and a top 320. The temperature sensor 200 of the battery 14 is positioned within the housing 296. The battery 14 has a battery support portion 322 complementary to and configured to couple to and be supported by the support structure 18 of the charger housing 16. As shown in FIGS. 14 and 17, the battery support portion 322 forms channels 324 with rails 326 that respectively engage with the rails 144, 148 and the grooves 152, 156 of the support structure 18.

As best shown in FIG. 14, the front side 308 of the battery 14 includes a flat surface 328 coupled to a slanted surface 332. The slanted surface 332 includes an inverted U-shaped member 336 positioned above terminals 1150 of the battery 14, as shown in FIGS. 14 and 17. An actuator 352 is positioned within the U-shaped member 336 and is configured to engage the protrusion 96 on the charger 10. In the illustrated construction, the actuator 352 is configured to operate a switch (not shown) in the battery 14, and the switch is operable to electrically connect and disconnect battery cells of the battery 14. The battery cells are supported by the housing 296. A similar switch and switching arrangement is described and illustrated in U.S. Provisional Patent Application No. 62/435,453, filed Dec. 16, 2016, the entire contents of which is hereby incorporated by reference.

The female battery terminals 1150 are couplable and electrically connectable to the charger terminals 1000. The battery terminals 1150 include power terminals 2100 and communication terminals 2105. As shown in FIG. 17, the battery power terminals 2100 include a ground terminal 2110 and a charging terminal 2115. The charging terminal 2115 and the ground terminal 2110 are connected to the terminals 1000 (e.g., the charger terminal 1115 and ground terminal 1110) of the charger 10 to charge battery cells (not shown) of the battery 14.

With reference to FIGS. 17 and 21A-21B, the battery communication (transmission/receiver) terminals 2105 include a positive transmission terminal 2125, a negative transmission terminal 2130, a positive receiver terminal 2135, and a negative receiver terminal 2140 and are connectable to the charger communication terminals (to the positive transmission terminal 1125, the negative transmission terminal 1130, the positive receiver terminal 1135, and the negative receiver terminal 1140, respectively). The battery communication terminals 2105 allow for differential communication between the battery 14 and the charger 10.

As with the charger communication terminals, the illustrated battery communication terminals 2105 (2125-2140) are only used to either receive or transmit data but not both. In other embodiments, the battery communication terminals 2105 follow a full-duplex standard (for example, RS485 standard). The battery communication terminals 2105 allow information (e.g., temperature, voltage, fault condition, etc.) for the battery 14 to be transmitted between the battery 14 to the charger microcontroller 1210. Again, as discussed below in more detail, this information may be used to control operation of the charger 10 (e.g., to adjust the speed of the fan 44 and/or a charging current).

FIG. 23 is a simplified block diagram of the charger 10. The charger 10 includes the charger microcontroller 1210, a charger memory 1215, a power converter 1220, a power source connector 1225, and a charger transceiver 1230. The power source connector 1225 connects to the external power source (e.g., an AC wall outlet) to receive power for charging the battery 14. The power converter 1220 converts AC power from the external power source to a DC power to charge the battery 14.

As best illustrated in FIG. 1, the battery 14 is configured to slide onto the support surface 140 of the charger 10 with the channels 324 and the rails 326 of the battery support portion 322 engaging the rails 144, 148 and the grooves 152, 156, respectively, of the charger support structure 18. During insertion of the battery 14, the AC micro switch 600 is activated before the DC micro switch 610. Also, the charger terminals 1000 (at least the power terminals) are electrically connected to the battery terminals 1150 before the DC micro switch 610 is activated.

As the battery 14 engages the charger 10, the battery 14 engages the actuator of the AC micro switch 600 to activate the switch 600. After activation of the switch 600, power is supplied to the charger electronics 28 (e.g., the power source is connected to the microcontroller 1210). As the battery 14 continues to be inserted onto the charger 10, the battery terminals 1150 electrically connect with the charger terminals 1000. After electrical connection of the terminals 1000, 1150, the battery engages the button 172 of the DC micro switch 610 to activate the switch 610. As such, the switch 600 is activated before the switch 610 during coupling of the battery 14 to the battery charger 10. Activation of the switch 610 powers the charger terminals 1000 (e.g., the switch 610 sends a signal to the microcontroller 1210 to initiate charging). The battery 14 is fully coupled to the charger 10 when the front 308 of the battery 14 abuts the back wall 80 of the charger 10. The switches 600, 610 are operable through engagement with the battery 14.

During removal, as the battery 14 is removed from charger 10, the DC micro switch 610 is deactivated before the charger terminals 1000 (again, at least the power terminals) disengage the battery terminals 1150 and before the AC micro switch 600 is deactivated. As the battery 14 disengages the button 172, the button 172 returns to its biased position (i.e., the first position as shown in FIG. 21B) projecting above the support surface 140. As such, the switch 610 is disengaged before the battery terminals 1150 disengage the charger terminals 1110, 1115 during removal of the battery 14 from the battery charger 10. The switch 610 sends a signal to the microcontroller 1210 to shut off charging.

Further removal of the battery 14 deactivates the AC micro switch 600 to shut off power from the power source to the charger 10. With the switch 600 deactivated, power is shut off to the charger electronics 28. With the battery 14 disengaged from the charger 10, there is no power to the charger terminals 1000 and through the charger electronics 28. In this condition, standby power to the charger 10 is near zero.

Using the AC micro switch 600 and the DC micro switch 610 may prevent or inhibit arcing (e.g., an electric arc cannot form between the battery terminals 1150 and the charger terminals 1000 as they engage/disengage because there is no power at the charger terminals 1000 unless the terminals 1000, 1150 are fully engaged). In other embodiments, only the AC micro switch 600 or the DC micro switch 610 may be included in the circuit 32.

Figure 25:
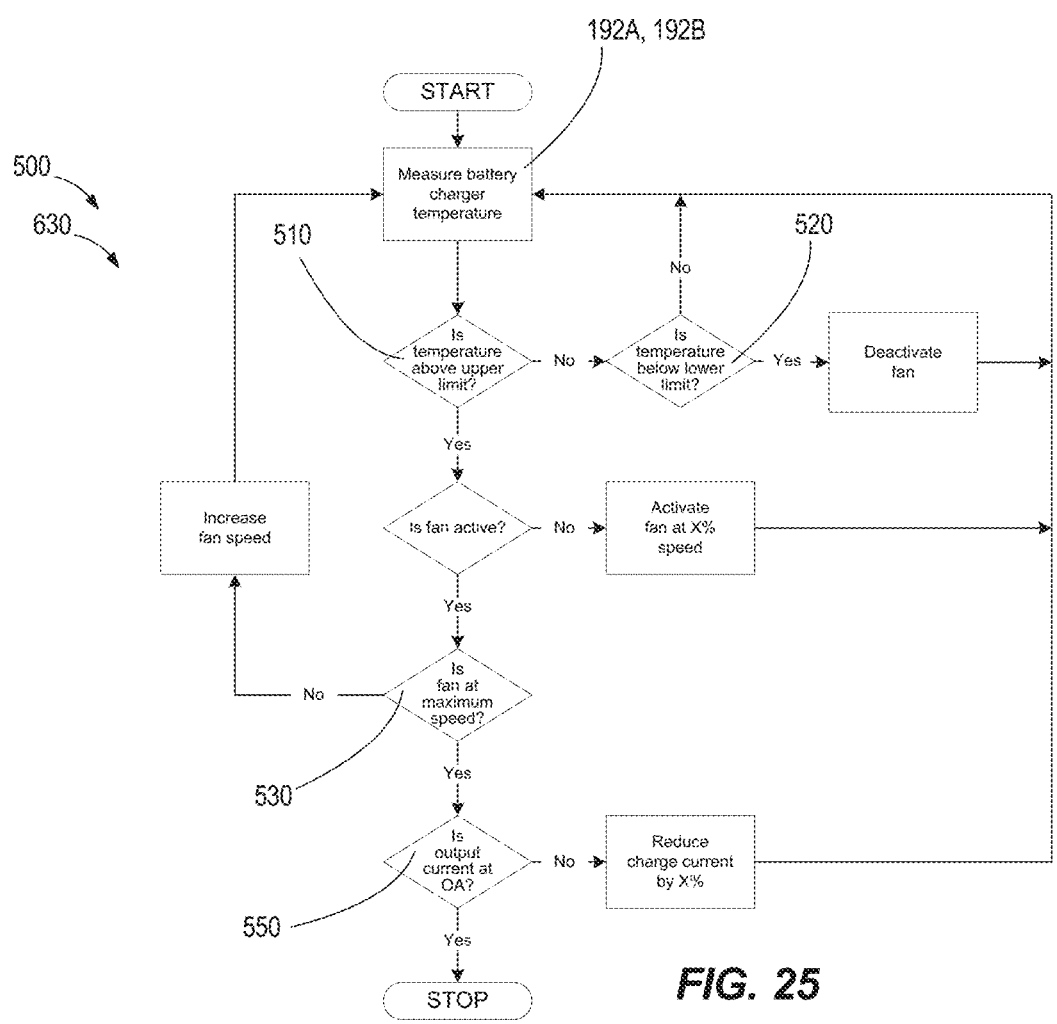
FIG. 25 is a flow chart illustrating a control process for adjusting charger current and fan speed based on temperature of the battery charger.
Figure 26:
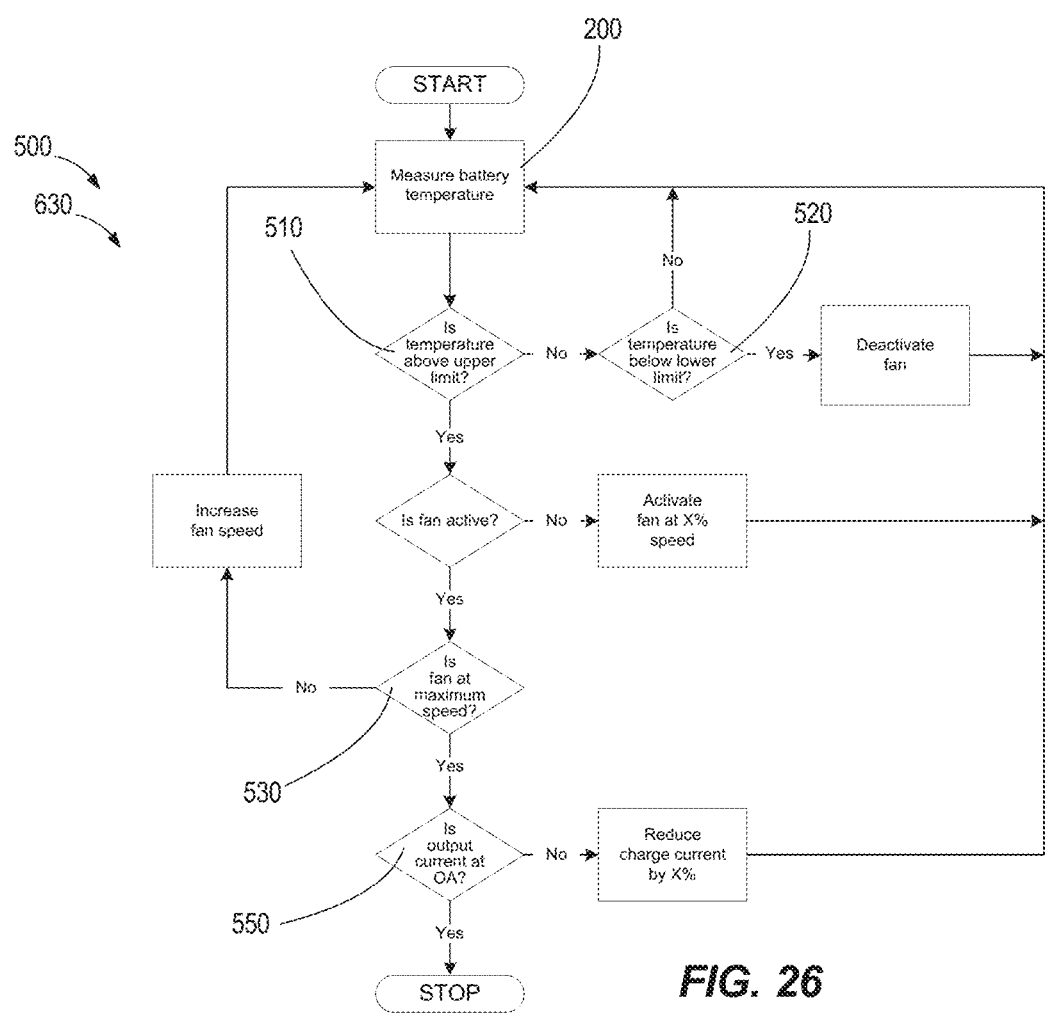
FIG. 26 is a flow chart illustrating a control process for adjusting charger current and fan speed based on temperature of the battery.

FIGS. 24-26 and 31-32 are flow charts illustrating control processes 500 performed by the charger microcontroller 1210 to control operation of the charger 10. In the process of FIG. 25, operation of the charger 10 (e.g., the speed of the fan 44 and/or the charger current) is adjusted based on the temperature of the charger 10 and the battery 14. In the process of FIG. 26, the speed of the fan 44 and/or the charger current is adjusted based on the temperature of the charger 10, while, in the process of FIG. 27, the speed of the fan 44 and/or the charger current is adjusted based on the temperature of the battery 14.

Figure 31:
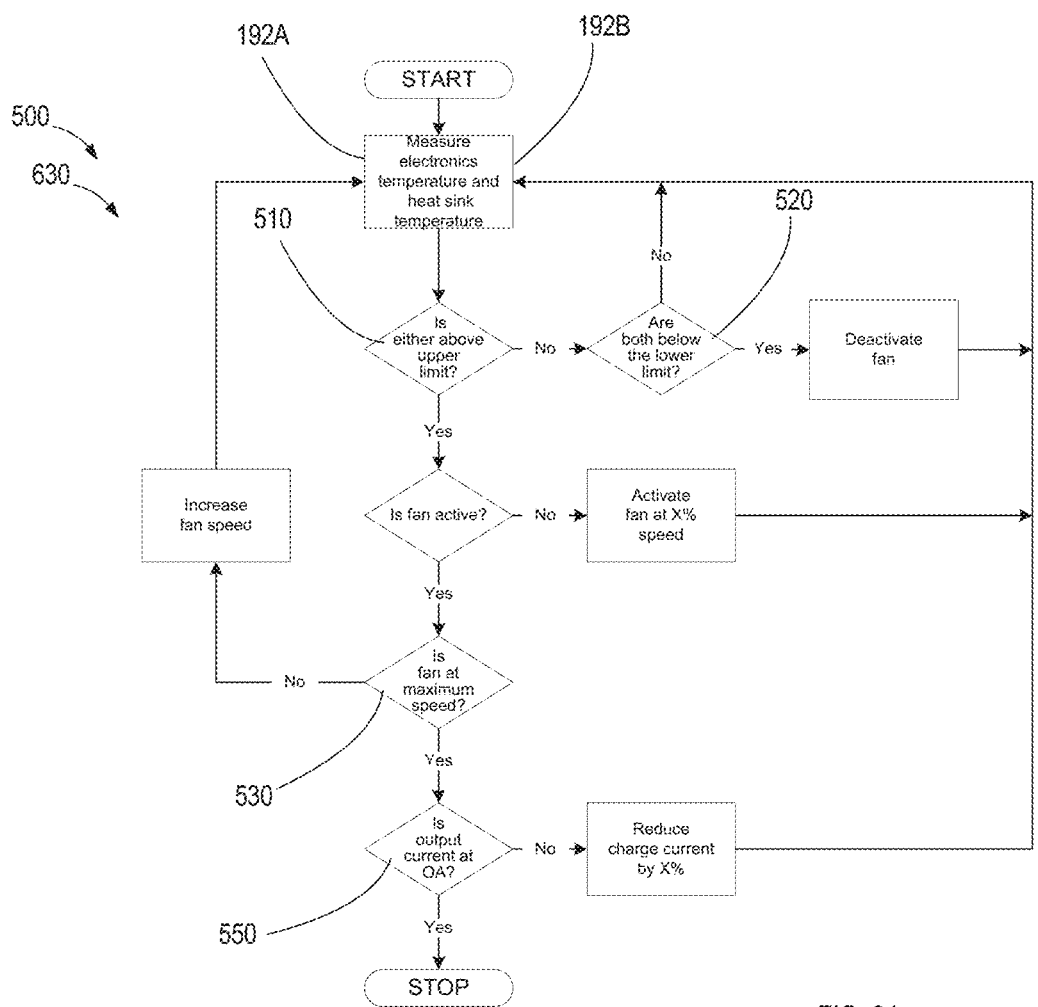
FIG. 31 is a flow chart illustrating a control process for adjusting charging current and fan speed based on temperature of electronics of the battery charger and a heat sink of the battery charger.
Figure 32:
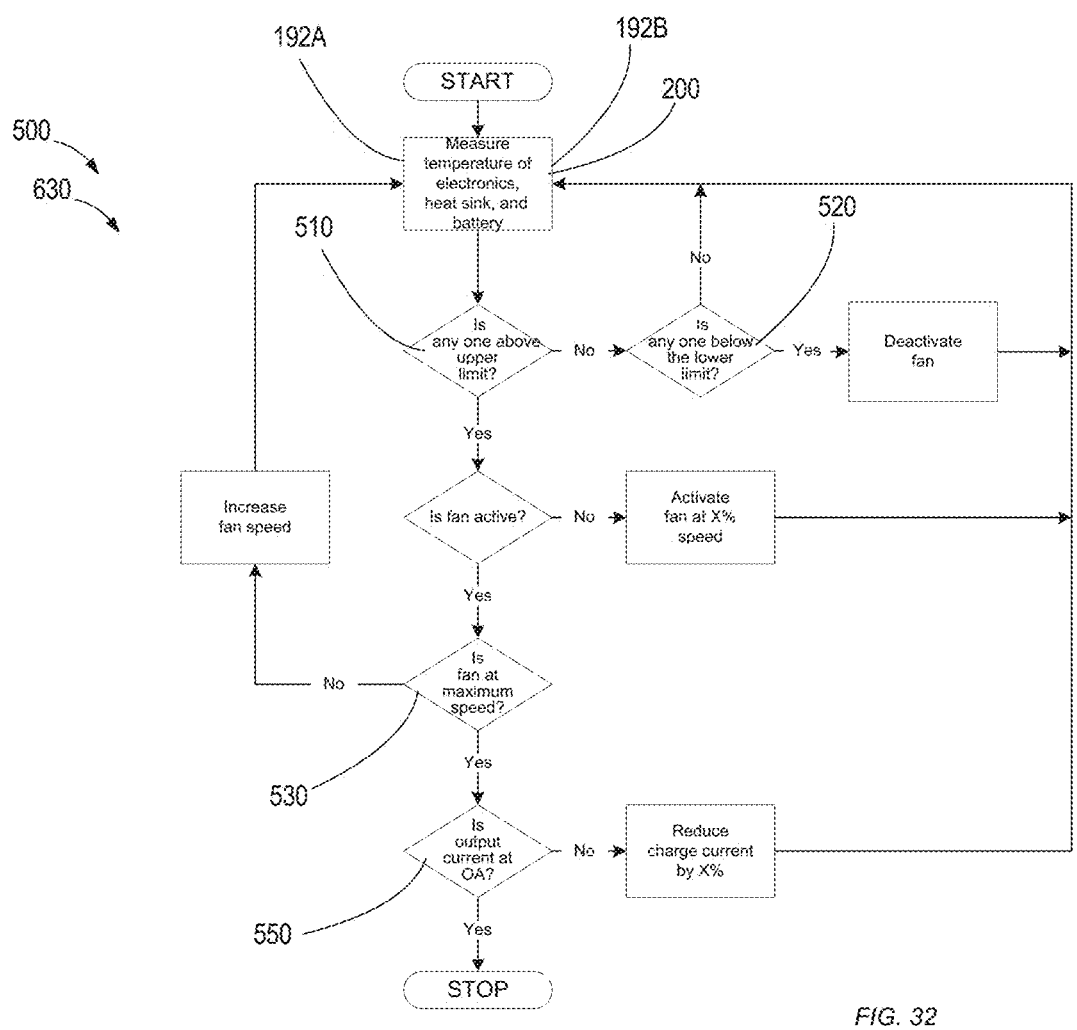
FIG. 32 is a flow chart illustrating a control process for adjusting charger current and fan speed based on temperature of electronics of the battery charger, a heat sink of the battery charger, and the battery.

In the process of FIG. 31, the speed of the fan 44 and/or the charger current is adjusted based on the temperature of the charger electronics 28 and the heat sink 40. In the process of FIG. 32, the speed of the fan 44 and/or the charger current is adjusted based on the temperature of the charger electronics 28, the heat sink 40, and the battery 14. In other processes (not shown), operation of the charger 10 may be controlled based on one or more of the sensed temperatures.

As mentioned above, in the illustrated construction, the fan 44 is a multi-speed fan. Whenever the battery 14 is connected to the charger 10, the microcontroller 1210 may be configured (see FIGS. 25 and 27) to detect the temperature of the battery 14 from the battery temperature sensor 200 through the charger communication terminals and the battery communication terminals 2105. In the processes of FIGS. 25-26, the temperature of the charger 10 (e.g., of the charger electronics 28 and/or of the heat sink(s) 40) is sensed by the charger temperature sensor 192 (e.g., the temperature sensor 192A and/or 192B) and the microcontroller 1210 may be configured to detect the charger temperature.

The microcontroller 1210 compares at least one of the battery temperature and the charger temperature (e.g., either, each, or both temperatures) to a first threshold (e.g., an upper limit 510 or a predetermined value for a maximum temperature the battery 14 or the charger 10 will experience before using other heat dissipating means). If the first threshold is not exceeded, the microcontroller 1210 compares the temperature(s) to a second threshold (e.g., a lower limit 520 the battery 14 or the charger 10). The battery temperature and the charger temperature continue to be detected in a loop until the charging of the battery 14 is deactivated (e.g., the battery 14 is disconnected from the charger 10 or the charging current output 550 of the charger 10 is zero (0) Amps (A)).

If the charger temperature or the battery temperature is less than the upper limit 510, then the charger temperature or the battery temperature are compared to a lower limit 520. If the charger temperature or the battery temperature is below the lower limit 520, then the fan 44 is deactivated/ remains off. As mentioned above, the battery temperature and the charger temperature continue to be detected in this loop until the battery temperature or the charger temperature or both are above the upper limit 510.

If the battery temperature or the charger temperature, or both are above the upper limit 510, then the microcontroller 1210 determines whether the fan 44 has already been activated. If the fan 44 has not been activated, then the fan 44 is activated at X % speed (e.g., about 50% speed). It should be understood that, in other embodiments, the fan 44 may be activated at a different speed (e.g., more than 50% (100%, 75%, etc.) or less than 50% (25%, 10%, etc.)). Also, the activation speed of the fan 44 may be based on the sensed temperature (e.g., higher for a higher temperature or lower for a lower temperature) and/or a duration the sensed temperature exceeds a threshold (e.g., higher for a longer duration or lower for a shorter duration).

If the fan 44 has already been activated, then the microcontroller 1210 determines whether the fan 44 is at a maximum speed 530. If the fan 44 is not at the maximum speed 530, then the speed of the fan 44 is increased by X % (e.g., about an additional 10%), and the loop starts over (i.e., measuring the battery temperature and the charger temperature). It should be understood that, in other embodiments, the speed of the fan 44 may be increased by a different amount (e.g., 5%, 15%, 25%, etc.)). Also, the increase in the speed of the fan 44 may be based on the sensed temperature and/or duration the sensed temperature exceeds a threshold.

If the fan 44 is at the maximum speed 530, the microcontroller 1210 measures the charging current output 550 of the charger 10. If the battery charger current output 550 is not 0 A, then the charge current is reduced by X % (e.g., about 10%), and the loop starts over (i.e. measuring the battery temperature and the charger temperature). It should be understood that, in other embodiments, the charge current may be reduced by a different amount (e.g., 5%, 15%, 25%, 50%, etc.)). Also, the reduction in the charge current may be based on the sensed temperature and/or duration the sensed temperature exceeds a threshold. If the charging current output 550 of the charger 10 is 0 A, then the charging operation 630 is deactivated by the microcontroller 1210, and the process 500 ends.

Therefore, the speed of the fan 44 may be adjusted based on the temperature of the battery 14, the temperature of the charger 10, or both. The charge current may also be adjusted based on the temperature of the battery 14, the temperature of the charger 10, or both. Thus, the charging operation 630 of the battery 14 may use the temperature of the battery 14, the temperature of the charger 10, or both.

Thus, the invention may provide, among other things, a charger 10 and a battery 14 couplable to the charger 10, a method for dissipating heat, and a method to prevent arcing between the terminals 1000 of the battery 14 and the terminals 1000 of the charger 10. The charger 10 may include a fan 44, a first temperature sensor, and a tubular heat sink 40 for dissipating heat. The circuit 32 of the charger 10 may include an AC micro switch 600 and a DC micro switch 610 to prevent arcing.

Although the invention has been described in detail with reference to certain preferred embodiments, variations and modifications exist within the scope and spirit of one or more independent aspects of the invention as described.

One or more independent features and/or independent advantages of the invention may be set forth in the claims.

What is claimed is:

1. A battery charger comprising:
    a housing;
    a charging circuit positioned within the housing and operable to output a charging current to charge a battery pack couplable to the battery charger, the charging circuit including a microcontroller and a charger terminal electrically connectable to a battery terminal of the battery pack;
    a first switch engageable with the battery pack to operate the first switch;
    a second switch engageable with the battery pack to operate the second switch; and
    a third switch controlled by the microcontroller to control initiation and termination of charging,
    wherein, when the battery pack disengages the battery charger:
        the second switch electrically disconnects the charging circuit from the battery terminal,
        the first switch electrically disconnects the charging circuit from a power source after the second switch electrically disconnects the charging circuit from the battery terminal, and
        the third switch is deactivated by the microcontroller after the second switch electrically disconnects the charging circuit from the battery terminal and the first switch electrically disconnects the charging circuit from the power source.

2. The battery charger of claim 1, further comprising:
    a heat sink; and
    a charger temperature sensor positioned within the housing, the charger temperature sensor configured to detect a temperature proximate one of the charging circuit or the heat sink.

3. The battery charger of claim 2, wherein the charger temperature sensor is mounted to the heat sink.

4. The battery charger of claim 2, wherein the charger temperature sensor is a first charger temperature sensor configured to detect the temperature proximate the charging circuit, the battery charger further comprising:
    a second charger temperature sensor configured to detect the temperature proximate the heat sink.

5. The battery charger of claim 1, further comprising:
    a printed circuit board; and
    a charger temperature sensor mounted on the printed circuit board.

6. The battery charger of claim 1, wherein the housing defines an air inlet and an air outlet, the battery charger further comprising:
    a heat sink operable to dissipate heat in the housing.

7. The battery charger of claim 6, further comprising:
    a fan operable to cause air flow from the air inlet to the air outlet and along the heat sink.

8. The battery charger of claim 7, wherein:
the heat sink is a tubular heat sink defining an air flow path;
the fan is operable to cause air flow through the air flow path;
the air flow path includes a path inlet and a path outlet; and
the fan is positioned between the path outlet and the air outlet.

9. The battery charger of claim 7, wherein the heat sink includes a plurality of tubes defining a plurality of flow paths.

10. The battery charger of claim 9, wherein the plurality of tubes are positioned adjacent to one another.

11. The battery charger of claim 9, wherein the plurality of tubes are stacked one above the other.

12. A method of operating a battery charger, the battery charging including a housing, a charging circuit positioned within the housing and operable to output a charging current to charge a battery pack couplable to the battery charger, the charging circuit including a microcontroller and a charger terminal electrically connectable to a battery terminal of the battery pack, the method comprising:
deactivating, when the battery pack is removed from the battery charger, a first switch to electrically disconnect the charging circuit from the battery terminal;
deactivating, when the battery pack is removed from the battery charger, a second switch to electrically disconnect the charging circuit from a power source; and
deactivating a third switch controlled by the microcontroller to control termination of charging after the first switch and the second switch are deactivated.

13. The method of claim 12, wherein the battery charger further includes a tubular heat sink and a sensor positioned proximate one of the charging circuit and the tubular heat sink, the method further comprising:
sensing a temperature of the battery charger; and
sensing a temperature of the battery pack.

14. The method of claim 13, wherein sensing a temperature of the battery charger includes sensing a temperature proximate one of the charging circuit or the tubular heat sink.

15. The method of claim 14, wherein:
the sensor is a first sensor mounted to the tubular heat sink;
the battery charger further includes a printed circuit board and a second sensor mounted to the printed circuit board; and
sensing a temperature of the battery charger includes sensing a temperature of the printed circuit board and sensing a temperature of the tubular heat sink.

16. The method of claim 13, wherein:
the battery pack includes a second sensor; and
sensing a temperature of the battery pack includes sensing a temperature of the battery pack using the second sensor.

17. The method of claim 13, wherein the battery charger includes a controller and a second sensor for sensing the temperature of the battery charger, and the battery pack includes a third sensor for sensing the temperature of the battery pack, the method further comprising:
receiving, with the controller, a signal indicative of the temperature of the battery charger from the second sensor and a signal indicative of the temperature of the battery pack from the third sensor.

18. The method of claim 12, wherein the housing defines an air inlet and an air outlet, and the battery charger includes a heat sink and a fan, the method further comprising:
causing air flow, by the fan, from the air inlet to the air outlet and along the heat sink.

19. The method of claim 18, wherein:
the heat sink is a tubular heat sink;
the tubular heat sink defines an air flow path; and
causing air flow includes causing air flow through the air flow path.

20. A battery charger comprising:
a housing;
a charging circuit positioned within the housing and operable to output a charging current to charge a battery pack couplable to the battery charger, the charging circuit including a microcontroller and a charger terminal electrically connectable to a battery terminal of the battery pack;
a first switch configured to electrically disconnect the charging circuit from the battery terminal when the battery pack disengages the battery charger;
a second switch configured to electrically disconnect the charging circuit from a power source when the battery pack disengages the battery charger; and
a third switch controlled by the microcontroller to control termination of charging,
wherein, when the battery pack disengages the battery charger, the first switch is deactivated before the second switch is deactivated, and the third switch is deactivated by the microcontroller after the first switch and the second switch are deactivated.

* * * * *